(12) United States Patent
Mizukoshi et al.

(10) Patent No.: US 12,550,592 B2
(45) Date of Patent: Feb. 10, 2026

(54) DISPLAY DEVICE AND MANUFACTURING METHOD OF DISPLAY DEVICE

(71) Applicant: Magnolia White Corporation, Tokyo (JP)

(72) Inventors: Hirofumi Mizukoshi, Tokyo (JP); Kaichi Fukuda, Tokyo (JP); Takanobu Takenaka, Tokyo (JP); Masaru Takayama, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 316 days.

(21) Appl. No.: 18/299,082

(22) Filed: Apr. 12, 2023

(65) Prior Publication Data

US 2023/0354678 A1 Nov. 2, 2023

(30) Foreign Application Priority Data

Apr. 28, 2022 (JP) ................. 2022-074873

(51) Int. Cl.
*H10K 59/80* (2023.01)
*H10K 59/12* (2023.01)
*H10K 59/122* (2023.01)

(52) U.S. Cl.
CPC ....... *H10K 59/873* (2023.02); *H10K 59/1201* (2023.02); *H10K 59/122* (2023.02)

(58) Field of Classification Search
CPC ............. H10K 59/1201; H10K 59/122; H10K 59/873; H10K 50/844
See application file for complete search history.

(56) References Cited

U.S. PATENT DOCUMENTS

| | | |
|---|---|---|
| 2004/0160170 A1 | 8/2004 | Sato et al. |
| 2009/0009069 A1 | 1/2009 | Takata |
| 2019/0088730 A1* | 3/2019 | Lee .................. H10K 59/80522 |
| 2019/0165063 A1 | 5/2019 | Lee et al. |
| 2019/0363275 A1 | 11/2019 | Ochi et al. |
| 2020/0212116 A1* | 7/2020 | Kim ..................... H10K 59/122 |

(Continued)

FOREIGN PATENT DOCUMENTS

| | | |
|---|---|---|
| JP | 2000-195677 A | 7/2000 |
| JP | 2001-93672 A | 4/2001 |

(Continued)

OTHER PUBLICATIONS

German Office Action issued Nov. 12, 2025, in corresponding DE Application No. 10 2023 203 334.8, 9pp.

*Primary Examiner* — Vongsavanh Sengdara
(74) *Attorney, Agent, or Firm* — XSENSUS LLP

(57) ABSTRACT

According to one embodiment, a manufacturing method of a display device includes forming processing substrate, forming an organic layer, forming an upper electrode, forming a transparent layer, and forming an inorganic layer. The forming the upper electrode includes inclining a first evaporation source with respect to a normal of the processing substrate and depositing a material emitted from the first evaporation source while conveying the processing substrate. The forming the inorganic layer includes inclining a second evaporation source to a side opposite to a side to which the first evaporation source is inclined and depositing a material emitted from the second evaporation source while conveying the processing substrate.

7 Claims, 20 Drawing Sheets

(56) References Cited

U.S. PATENT DOCUMENTS

2021/0074795 A1\* 3/2021 Tomioka .............. H10K 59/131
2022/0077251 A1    3/2022 Choung et al.
2022/0344417 A1\* 10/2022 Choung ........... H10K 59/80522

FOREIGN PATENT DOCUMENTS

| | | |
|---|---|---|
| JP | 2004-200027 A | 7/2004 |
| JP | 2004-207217 A | 7/2004 |
| JP | 2008-135325 A | 6/2008 |
| JP | 2009-32673 A | 2/2009 |
| JP | 2010-118191 A | 5/2010 |
| WO | 2018/179308 A1 | 10/2018 |

\* cited by examiner

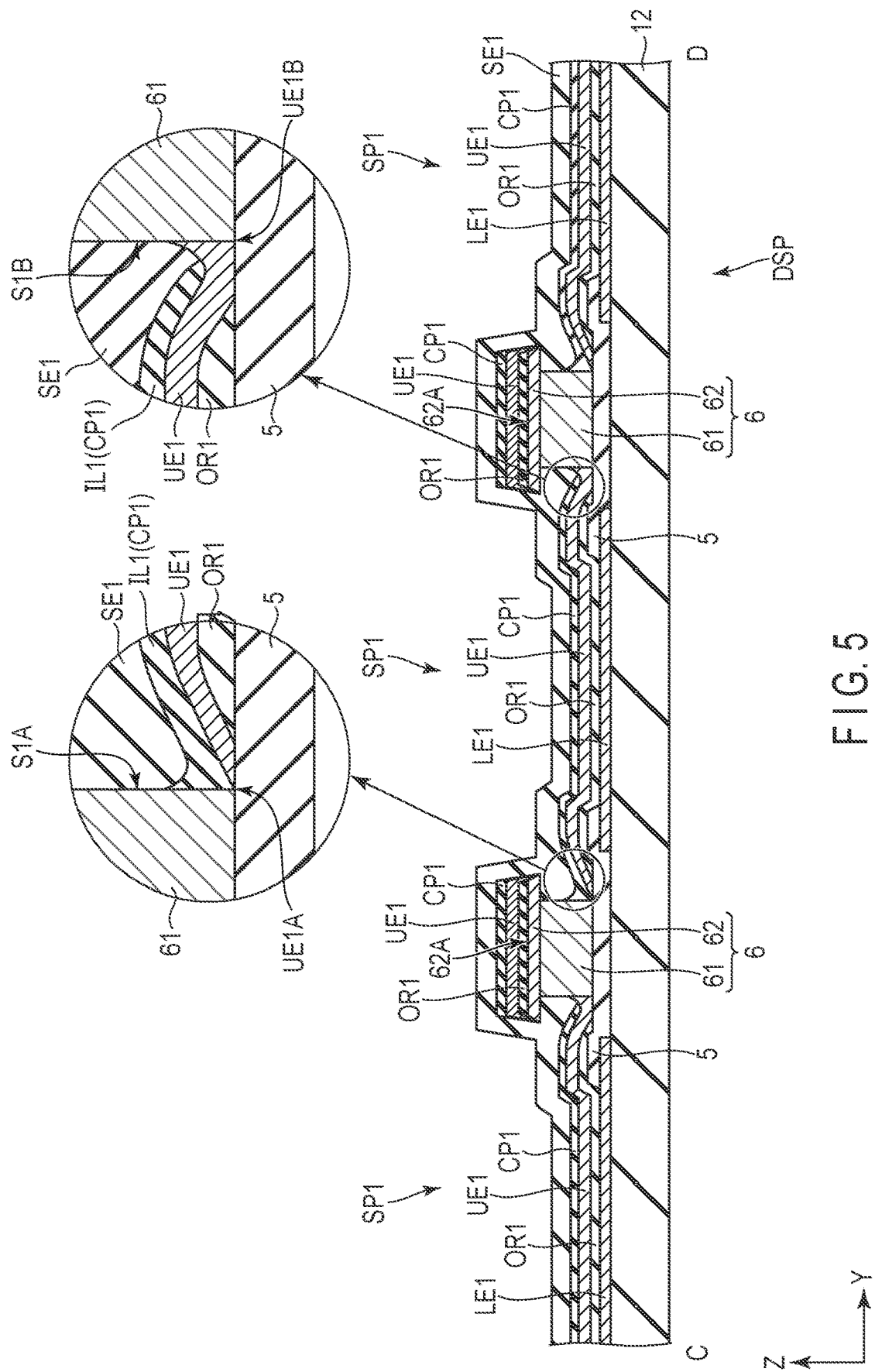
F I G. 5

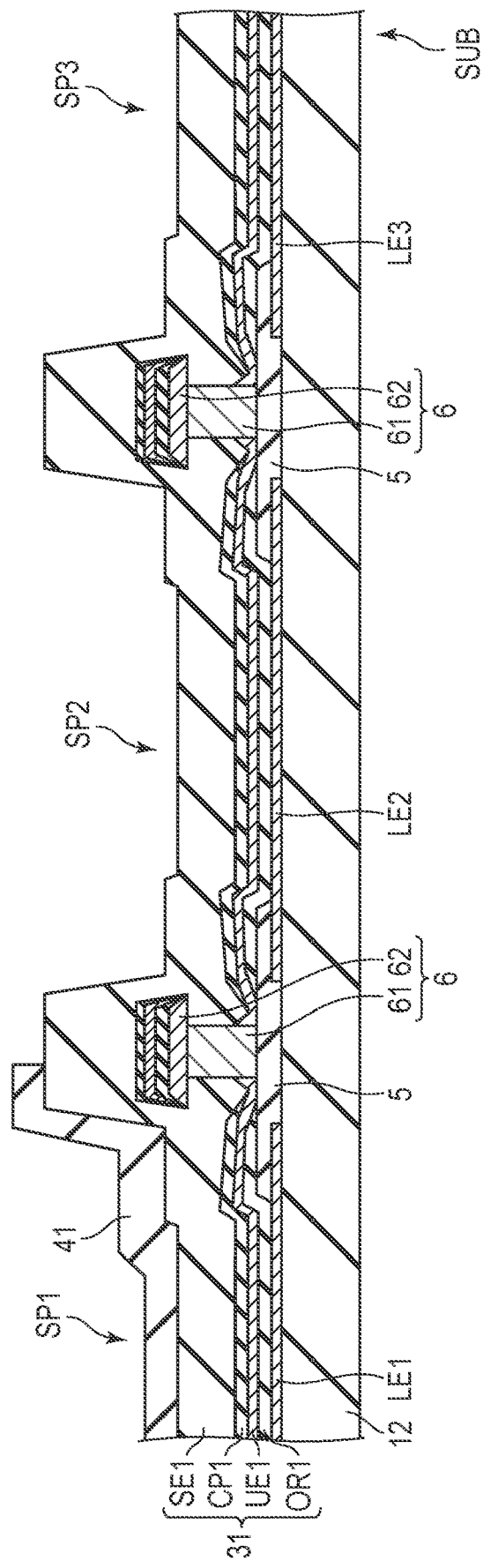
F I G. 17

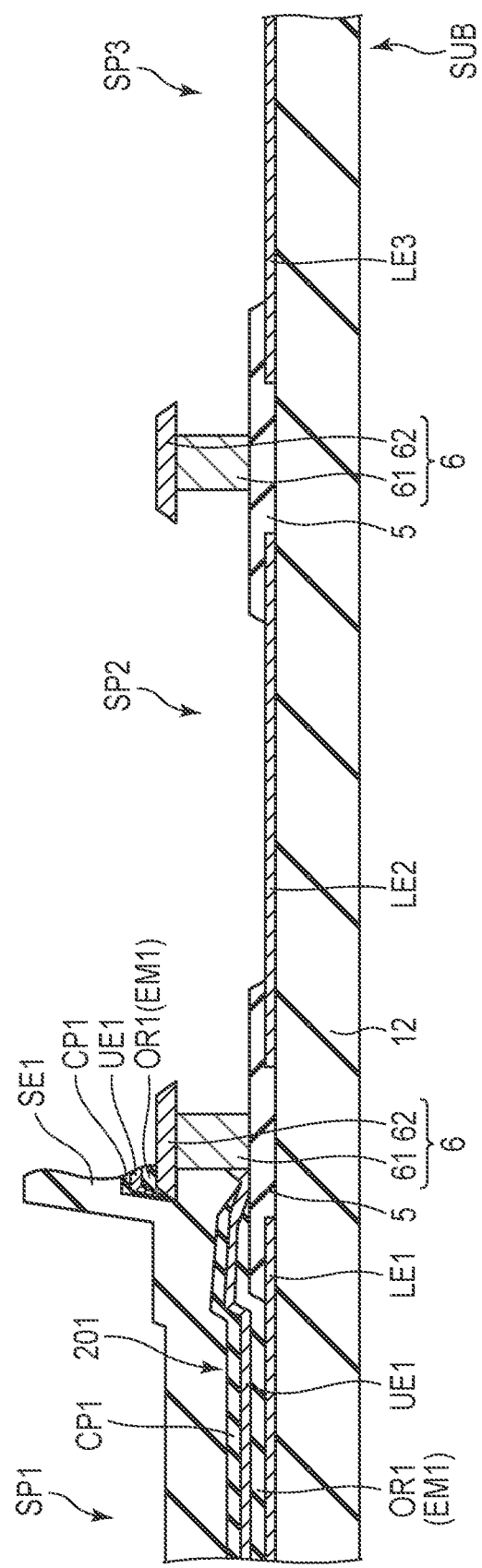
F I G. 20

DISPLAY DEVICE AND MANUFACTURING METHOD OF DISPLAY DEVICE

CROSS-REFERENCE TO RELATED APPLICATIONS

This application is based upon and claims the benefit of priority from Japanese Patent Application No. 2022-074873, filed Apr. 28, 2022, the entire contents of which are incorporated herein by reference.

FIELD

Embodiments described herein relate generally to a display device and a manufacturing method of the display device.

BACKGROUND

In recent years, display devices to which organic light-emitting diodes (OLEDs) are applied as display elements have been put into practice. The display elements comprise a pixel circuit including a thin-film transistor, a lower electrode connected to the pixel circuit, an organic layer covering the lower electrode, and an upper electrode covering the organic layer. The organic layer includes functional layers such as a hole-transport layer and an electron-transport layer in addition to a light-emitting layer.

In the process of manufacturing such display elements, a technique of suppressing the degradation of reliability has been required.

BRIEF DESCRIPTION OF THE DRAWINGS

FIG. 5 is a schematic cross-sectional view of the display device DSP along line C-D in FIG. 2.

FIG. 17 is a diagram for explaining the manufacturing method of the display device DSP.

FIG. 20 is a diagram for explaining the manufacturing method of the display device DSP.

DETAILED DESCRIPTION

Figure 1:
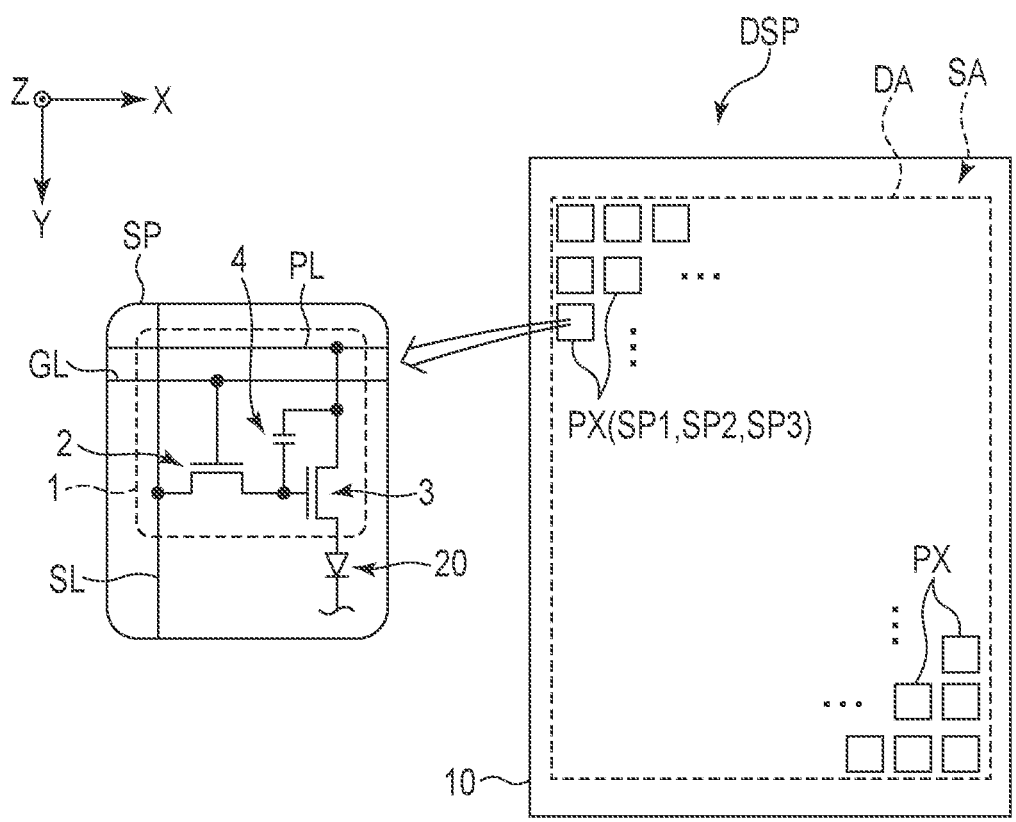
FIG. 1 is a diagram showing a configuration example of a display device DSP.

The embodiments described herein aim to provide a display device and a manufacturing method of the display device which can suppress the degradation of reliability.

In general, according to one embodiment, a manufacturing method of a display device, comprises preparing a processing substrate by forming a lower electrode above a substrate, forming a rib comprising an aperture overlapping the lower electrode, and forming a partition including a lower part located on the rib and an upper part located on the lower part and projecting from a side surface of the lower part, forming an organic layer on the lower electrode in the aperture, forming an upper electrode on the organic layer, forming a transparent layer on the upper electrode, and forming an inorganic layer on the transparent layer. The forming the upper electrode comprises inclining a first evaporation source with respect to a normal of the processing substrate and depositing a material emitted from the first evaporation source while conveying the processing substrate. The forming the inorganic layer comprises inclining a second evaporation source to a side opposite to a side to which the first evaporation source is inclined with respect to the normal of the processing substrate and depositing a material emitted from the second evaporation source while conveying the processing substrate.

According to another embodiment, a display device comprises a substrate, a lower electrode disposed above the substrate, a rib comprising an aperture overlapping the lower electrode, a partition comprising a lower part disposed on the rib and an upper part disposed on the lower part and projecting from a side surface of the lower part, an organic layer disposed on the lower electrode in the aperture, an upper electrode disposed on the organic layer, a transparent layer disposed on the upper electrode, an inorganic layer disposed on the transparent layer, and a sealing layer covering the inorganic layer and in contact with the lower part of the partition. The upper electrode comprises a first end portion and a second end portion opposite to the first end portion. The first end portion is covered by the inorganic layer. The second end portion is exposed through the inorganic layer and being covered by the sealing layer.

According to an embodiment, a display device and a manufacturing method of the display device which can suppress the degradation of reliability can be provided.

Embodiments will be described hereinafter with reference to the accompanying drawings.

Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Further, in order to make the descriptions more easily understandable, some of the drawings illustrate an X axis, a Y axis and a Z axis orthogonal to each other. A direction along the X axis is referred to as a first direction, a direction along the Y axis is referred to as a second direction and a direction along the Z axis is referred to as a third direction. Viewing structural elements parallel to the third direction Z is referred to as plan view.

The display device of this embodiment is an organic electroluminescent display device comprising an organic light-emitting diode (OLED) as a display element, and can be mounted on televisions, personal computers, in-vehicle devices, tablets, smartphones, mobile phones and the like.

FIG. 1 is a diagram showing a configuration example of a display device DSP.

The display device DSP comprises a display area DA where an image is displayed and a surrounding area SA surrounding the display area DA on an insulating substrate 10. The substrate 10 may be glass or a flexible resin film.

In the present embodiment, the shape of the substrate 10 in plan view is a rectangle. However, the shape of the substrate 10 in plan view is not limited to a rectangle, and may be another shape such as a square, a circle, or an ellipse.

The display area DA comprises pixels PX arrayed in a matrix in the first direction X and the second direction Y. Each pixel PX includes subpixels SP. For example, the pixel PX includes a subpixel SP1 of a first color, a subpixel SP2 of a second color, and a subpixel SP3 of a third color. The first color, the second color, and the third color are colors different from each other. The pixel PX may include a subpixel SP of another color such as white in addition to the subpixels SP1, SP2, and SP3 or instead of one of the subpixels SP1, SP2, and SP3.

The subpixels SP each comprise a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are, for example, switching elements constituted of thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. One of a source electrode and a drain electrode of the drive transistor 3 is connected to a power line PL and the capacitor 4, and the other is connected to an anode of the display element 20.

The configuration of the pixel circuit 1 is not limited to the example shown in the figure. For example, the pixel circuit 1 may comprise more thin-film transistors and capacitors.

The display element 20 is an organic light-emitting diode (OLED) as a light-emitting element, and may be referred to as an organic EL element.

Figure 2:
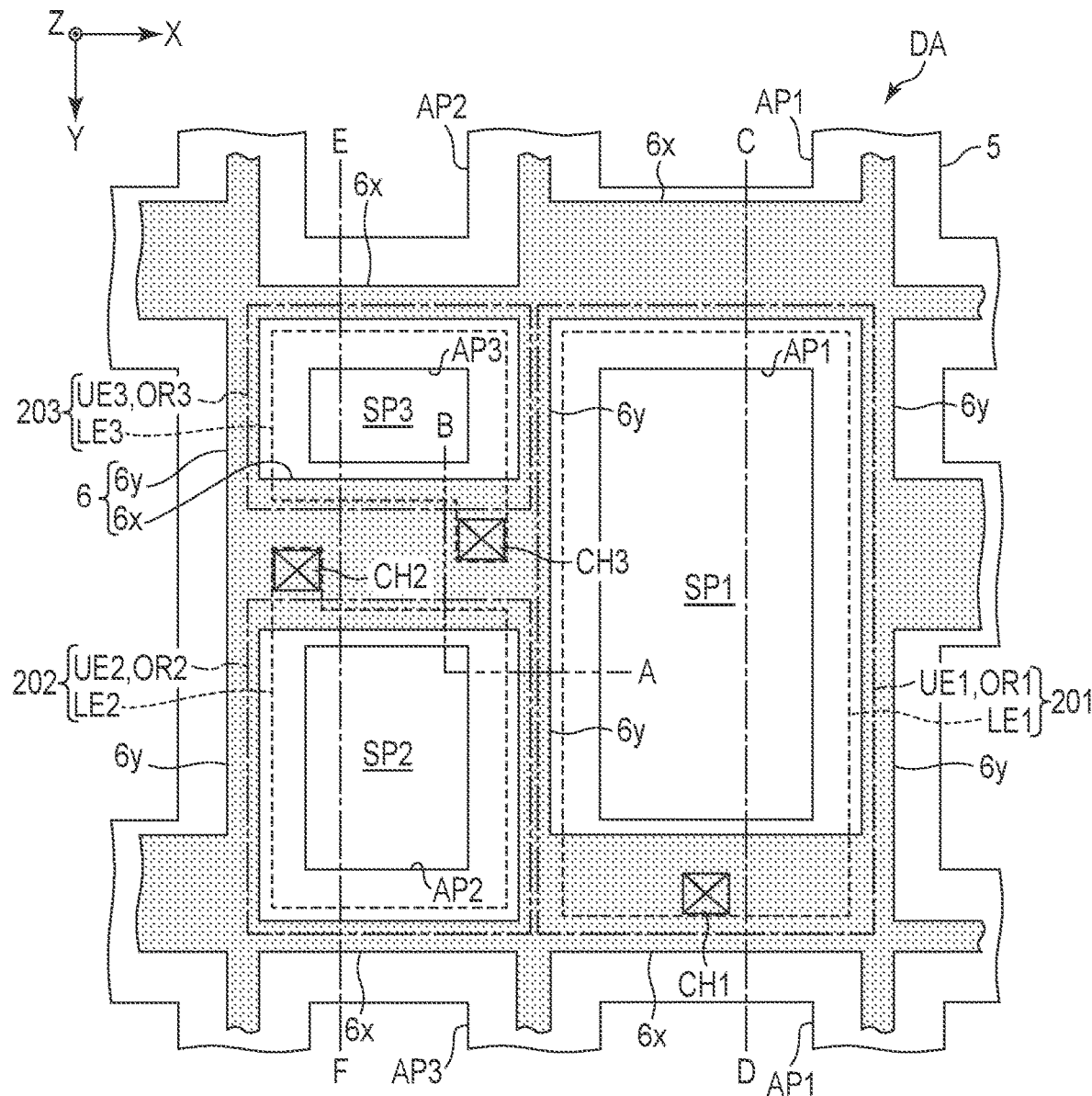
FIG. 2 is a diagram showing an example of the layout of subpixels SP1, SP2, and SP3.

FIG. 2 is a diagram showing an example of the layout of subpixels SP1, SP2, and SP3.

In the example of FIG. 2, the subpixel SP2 and the subpixel SP3 are arranged in the second direction Y. Moreover, each of the subpixels SP2 and SP3 is adjacent to subpixel SP1 in the first direction X.

When the subpixels SP1, SP2, and SP3 have the above-described layout, a column of subpixels SP2 and SP3 disposed alternately in the second direction Y and a column of subpixels SP1 disposed in the second direction Y are formed in the display area DA. These columns are arranged alternately in the first direction X.

The layout of the subpixels SP1, SP2, and SP3 is not limited to the example of FIG. 2. As another example, the subpixels SP1, SP2, and SP3 in each of the pixels PX may be arranged in order in the first direction X.

In the display area DA, a rib 5 and a partition 6 are disposed. The rib 5 comprises apertures AP1, AP2, and AP3 in the subpixels SP1, SP2, and SP3, respectively.

The partition 6 overlaps the rib 5 in plan view. The partition 6 comprises first partitions 6x extending in the first direction X and second partitions 6y extending in the second direction Y. The first partitions 6x are disposed between the apertures AP2 and AP3 adjacent to each other in the second direction Y and between the two apertures AP1 adjacent to each other in the second direction Y, respectively. The second partitions 6y are disposed between the apertures AP1 and AP2 adjacent to each other in the first direction X and between the apertures AP1 and AP3 adjacent to each other in the first direction X, respectively.

In the example of FIG. 2, the first partitions 6x and the second partitions 6y are connected to each other. The partition 6 is thereby formed into a lattice form surrounding the apertures AP1, AP2, and AP3 as a whole. It is also possible to say that the partition 6 comprises apertures at the subpixels SP1, SP2, and SP3 in the same way as the rib 5.

The subpixels SP1, SP2, and SP3 comprise display elements 201, 202, and 203, respectively, as the display elements 20.

The subpixel SP1 comprises a lower electrode LE1, an upper electrode UE1, and an organic layer OR1 each overlapping the aperture AP1. The subpixel SP2 comprises a lower electrode LE2, an upper electrode UE2, and an organic layer OR2 each overlapping the aperture AP2. The subpixel SP3 comprises a lower electrode LE3, an upper electrode UE3, and an organic layer OR3 each overlapping the aperture AP3.

In the example of FIG. 2, the external shapes of the lower electrodes LE1, LE2, and LE3 are represented by broken lines and the external shapes of the organic layers OR1, OR2, and OR3 and the upper electrodes UE1, UE2, and UE3 are represented by alternate long and short dashed lines. The respective peripheries of the lower electrodes LE1, LE2, and LE3 overlap the rib 5. The respective external shapes of the lower electrodes, the organic layers, and the upper electrodes shown in the figure do not necessarily reflect their exact shapes.

The lower electrode LE1, the upper electrode UE1, and the organic layer OR1 constitute the display element 201 of the subpixel SP1. The lower electrode LE2, the upper electrode UE2, and the organic layer OR2 constitute the display element 202 of the subpixel SP2. The lower electrode LE3, the upper electrode UE3, and the organic layer OR3 constitute the display element 203 of the subpixel SP3.

The lower electrodes LE1, LE2, and LE3 correspond to, for example, anodes of the display elements. The upper electrodes UE1, UE2, and UE3 correspond to cathodes of the display elements or common electrodes.

The lower electrode LE1 is connected to the pixel circuit 1 (refer to FIG. 1) of the subpixel SP1 through a contact hole CH1. The lower electrode LE2 is connected to the pixel circuit 1 of the subpixel SP2 through a contact hole CH2. The lower electrode LE3 is connected to the pixel circuit 1 of the subpixel SP3 through a contact hole CH3.

In the example of FIG. 2, the area of the aperture AP1 is larger than the area of the aperture AP2, and the area of the aperture AP2 is larger than the area of the aperture AP3. In other words, the area of the lower electrode LE1 exposed through the aperture AP1 is larger than the area of the lower electrode LE2 exposed through the aperture AP2, and the area of the lower electrode LE2 exposed through the aperture AP2 is larger than the area of the lower electrode LE3 exposed through the aperture AP3.

For example, the display element 201 of the subpixel SP1 is configured to emit light in the blue wavelength range. In addition, the display element 202 of the subpixel SP2 is configured to emit light in the green wavelength range, and the display element 203 of the subpixel SP3 is configured to emit light in the red wavelength range.

Figure 3:
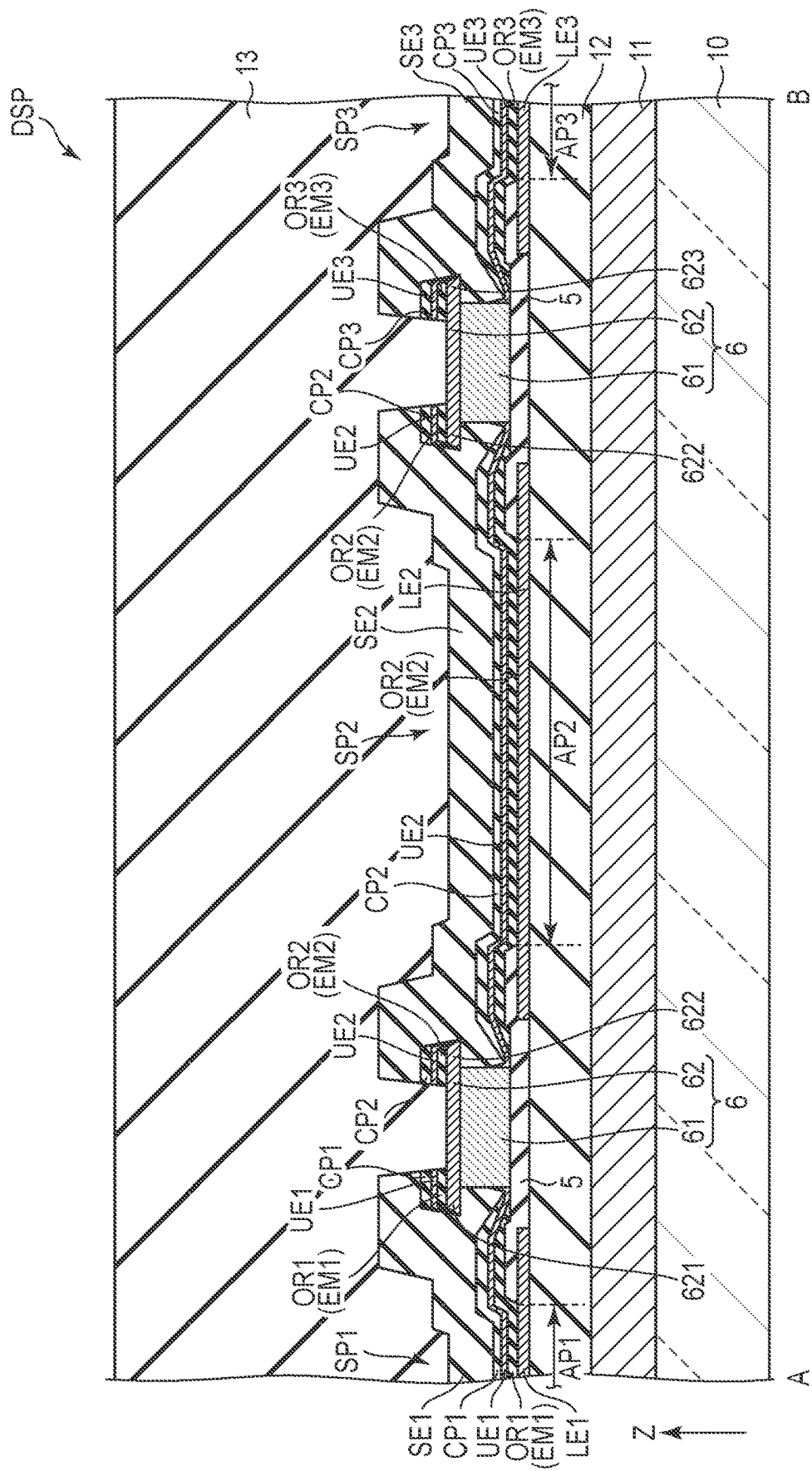
FIG. 3 is a schematic cross-sectional view of the display device DSP along line A-B in FIG. 2.

FIG. 3 is a schematic cross-sectional view of the display device DSP along line A-B in FIG. 2.

A circuit layer 11 is disposed on the above-described substrate 10. The circuit layer 11 includes various circuits such as the pixel circuit 1 and various lines such as the scanning line GL, the signal line SL, and the power line PL, which are shown in FIG. 1. The circuit layer 11 is covered by an insulating layer 12. The insulating layer 12 functions as a planarizing film which planarizes irregularities caused by the circuit layer 11.

The lower electrodes LE1, LE2, and LE3 are disposed on the insulating layer 12. The rib 5 is disposed on the insulating layer 12 and the lower electrodes LE1, LE2, and LE3. The end portions of the lower electrodes LE1, LE2, and LE3 are covered by the rib 5. That is, the end portions of the lower electrodes LE1, LE2, and LE3 are disposed between the insulating layer 12 and the rib 5. Between the adjacent lower electrodes of the lower electrodes LE1, LE2, and LE3, the insulating layer 12 is covered by the rib 5.

The partition 6 includes a lower part (stem) 61 disposed on the rib 5 and an upper part (shade) 62 disposed on the lower part 61. The lower part 61 of the partition 6 shown in the left side of the figure is located between the aperture AP1 and the aperture AP2. The lower part 61 of the partition 6 shown in the right side of the figure is located between the aperture AP2 and the aperture AP3. The upper part 62 has a width greater than that of the lower part 61. For this reason, in FIG. 3, both end portions of the upper part 62 project more than the side surfaces of the lower part 61. Such a shape of the partition 6 also can be referred to as an overhang form. Of the upper part 62, the portion projecting toward the aperture AP1 more than the lower part 61 is referred to as a projecting portion 621, the portion projecting toward the aperture AP2 more than the lower part 61 is referred to as a projecting portion 622, and the portion projecting toward the aperture AP3 more than the lower part 61 is referred to as a projecting portion 623.

The organic layer OR1 is in contact with the lower electrode LE1 through the aperture AP1, covers the lower electrode LE1, and overlaps part of the rib 5. The upper electrode UE1 is opposed to the lower electrode LE1, and is disposed on the organic layer OR1. Moreover, the upper electrode UE1 is in contact with a side surface of the lower part 61. The organic layer OR1 and the upper electrode UE1 are located lower than the upper part 62.

The organic layer OR2 is in contact with the lower electrode LE2 through the aperture AP2, covers the lower electrode LE2, and overlaps part of the rib 5. The upper electrode UE2 is opposed to the lower electrode LE2, and is disposed on the organic layer OR2. Moreover, the upper electrode UE2 is in contact with a side surface of the lower part 61. The organic layer OR2 and the upper electrode UE2 are located lower than the upper part 62.

The organic layer OR3 is in contact with the lower electrode LE3 through the aperture AP3, covers the lower electrode LE3, and overlaps part of the rib 5. The upper electrode UE3 is opposed to the lower electrode LE3, and is disposed on the organic layer OR3. Moreover, the upper electrode UE3 is in contact with a side surface of the lower part 61. The organic layer OR3 and the upper electrode UE3 are located lower than the upper part 62.

In the example shown in FIG. 3, the subpixels SP1, SP2, and SP3 include cap layers (optical adjustment layers) CP1, CP2, and CP3 for adjusting the optical properties of light emitted by light-emitting layers of the organic layers OR1, OR2, and OR3.

The cap layer CP1 is located at the aperture AP1, located lower than the upper part 62, and disposed on the upper electrode UE1. The cap layer CP2 is located at the aperture AP2, located lower than the upper part 62, and disposed on the upper electrode UE2. The cap layer CP3 is located at the aperture AP3, located lower than the upper part 62, and disposed on the upper electrode UE3.

In the subpixels SP1, SP2, and SP3, sealing layers SE1, SE2, and SE3 are disposed, respectively.

The sealing layer SE1 is in contact with the cap layer CP1 and the lower part 61 and the upper part 62 of the partition 6, and continuously covers each member of the subpixel SP1. The sealing layer SE2 is in contact with the cap layer CP2 and the lower part 61 and the upper part 62 of the partition 6, and continuously covers each member of the subpixel SP2. The sealing layer SE3 is in contact with the cap layer CP3 and the lower part 61 and the upper part 62 of the partition 6, and continuously covers each member of the subpixel SP3.

The sealing layers SE1, SE2, and SE are covered by a protective layer 13.

In the example shown in FIG. 3, part of the organic layer OR1, part of the upper electrode UE1, and part of the cap layer CP1 are located between the partition 6 and the sealing layer SE1, disposed on the upper part 62, and separated from the portions located lower than the upper part 62.

In addition, part of the organic layer OR2, part of the upper electrode UE2, and part of the cap layer CP2 are located between the partition 6 and the sealing layer SE2, disposed on the upper part 62, and separated from the portions located lower than the upper part 62.

Furthermore, part of the organic layer OR3, part of the upper electrode UE3, and part of the cap layer CP3 are located between the partition 6 and the sealing layer SE3, disposed on the upper part 62, and separated from the portions located lower than the upper part 62.

The insulating layer 12 is an organic insulating layer. The rib 5 and the sealing layers SE1, SE2, and SE3 are inorganic insulating layers.

The sealing layers SE1, SE2, and SE3 are formed of, for example, the same inorganic insulating material.

The rib 5 is formed of silicon nitride (SiNx), which is an example of an inorganic insulating material. The rib 5 may be formed as a single-layer body of any one of silicon oxide (SiOx), silicon oxynitride (SiON), and aluminum oxide ($Al_2O_3$) as another inorganic insulating material. In addition, the rib 5 may be formed as a stacked layer body composed of at least two of a silicon nitride layer, a silicon oxide layer, a silicon oxynitride layer, and an aluminum oxide layer.

The sealing layers SE1, SE2, and SE3 are formed of silicon nitride (SiNx), which is an example of an inorganic insulating material. The sealing layers SE1, SE2, and SE3 may be formed as a single-layer body of any one of silicon oxide (SiOx), silicon oxynitride (SiON), and aluminum oxide ($Al_2O_3$) as another inorganic insulating material. In addition, the sealing layers SE1, SE2, and SE3 may be formed as a stacked layer body composed of at least two of a silicon nitride layer, a silicon oxide layer, a silicon oxynitride layer, and an aluminum oxide layer. Thus, the sealing layers SE1, SE2, and SE3 can be formed of the same material as the rib 5.

The lower part 61 of the partition 6 is formed of a conductive material, and is electrically connected to each of the upper electrodes UE1, UE2, and UE3. Both of the lower part 61 and the upper part 62 of the partition 6 may have conductivity.

The thickness of the rib 5 is sufficiently smaller than those of the partition 6 and the insulating layer 12. For example, the thickness of the rib 5 is greater than or equal to 200 nm but less than or equal to 400 nm.

The thickness of the lower part 61 of the partition 6 (thickness from the top surface of the rib 5 to the bottom surface of the upper part 62) is greater than the thickness of the rib 5.

The thickness of the sealing layer SE1, the thickness of the sealing layer SE2, and the thickness of the sealing layer SE3 are substantially equal.

The lower electrodes LE1, LE2, and LE3 may be formed of a transparent conductive material such as ITO, or may have a multilayered structure of a metallic material such as silver (Ag) and a transparent conductive material. The upper electrodes UE1, UE2, and UE3 are formed of a metallic material, for example, an alloy of magnesium and silver (MgAg). The upper electrodes UE1, UE2, and UE3 may be formed of a transparent conductive material such as ITO.

Each of the organic layers OR1, OR2, and OR3 includes functional layers such as a hole-injection layer, a hole-transport layer, an electron-blocking layer, a hole-blocking layer, an electron-transport layer, and an electron-injection layer. In addition, the organic layer OR1 includes a light-emitting layer EM1. The organic layer OR2 includes a light-emitting layer EM2. The light-emitting layer EM2 is formed of a material different from that of the light-emitting layer EM1. The organic layer OR3 includes a light-emitting layer EM3. The light-emitting layer EM3 is formed of a material different from those of the light-emitting layers EM1 and EM2.

The material for forming the light-emitting layer EM1, the material for forming the light-emitting layer EM2, and the material for forming the light-emitting layer EM3 are materials which emit light in wavelength ranges different from each other.

For example, the light-emitting layer EM1 is formed of a material which emits light in the blue wavelength range, the light-emitting layer EM2 is formed of a material which emits light in the green wavelength range, and the light-emitting layer EM3 is formed of a material which emits light in the red wavelength range.

The cap layers CP1, CP2, and CP3 are formed of, for example, a multilayered body of transparent thin films. The multilayered body may include a thin film formed of an inorganic material and a thin film formed of an organic material as the thin films. The thin films have refractive indices different from each other. The materials of the thin films constituting the multilayered body are different from the material of the upper electrodes UE1, UE2, and UE3 and are also different from the material of the sealing layers SE1, SE2, and SE3. The cap layers CP1, CP2, and CP3 may be omitted.

The protective layer 13 is formed of a multilayered body of transparent thin films, and includes, for example, a thin film formed of an inorganic material and a thin film formed of an organic material as the thin films.

A common voltage is applied to the partition 6. This common voltage is applied to each of the upper electrodes UE1, UE2, and UE3, which are in contact with the side surfaces of the lower part 61. To the lower electrodes LE1, LE2, and LE3, a pixel voltage is applied via the respective pixel circuits 1 of the subpixels SP1, SP2, and SP3.

When a potential difference is formed between the lower electrode LE1 and the upper electrode UE1, the light-emitting layer EM1 of the organic layer OR1 emits light in the blue wavelength range. When a potential difference is formed between the lower electrode LE2 and the upper electrode UE2, the light-emitting layer EM2 of the organic layer OR2 emits light in the green wavelength range. When a potential difference is formed between the lower electrode LE3 and the upper electrode UE3, the light-emitting layer EM3 of the organic layer OR3 emits light in the red wavelength range.

Figure 4:
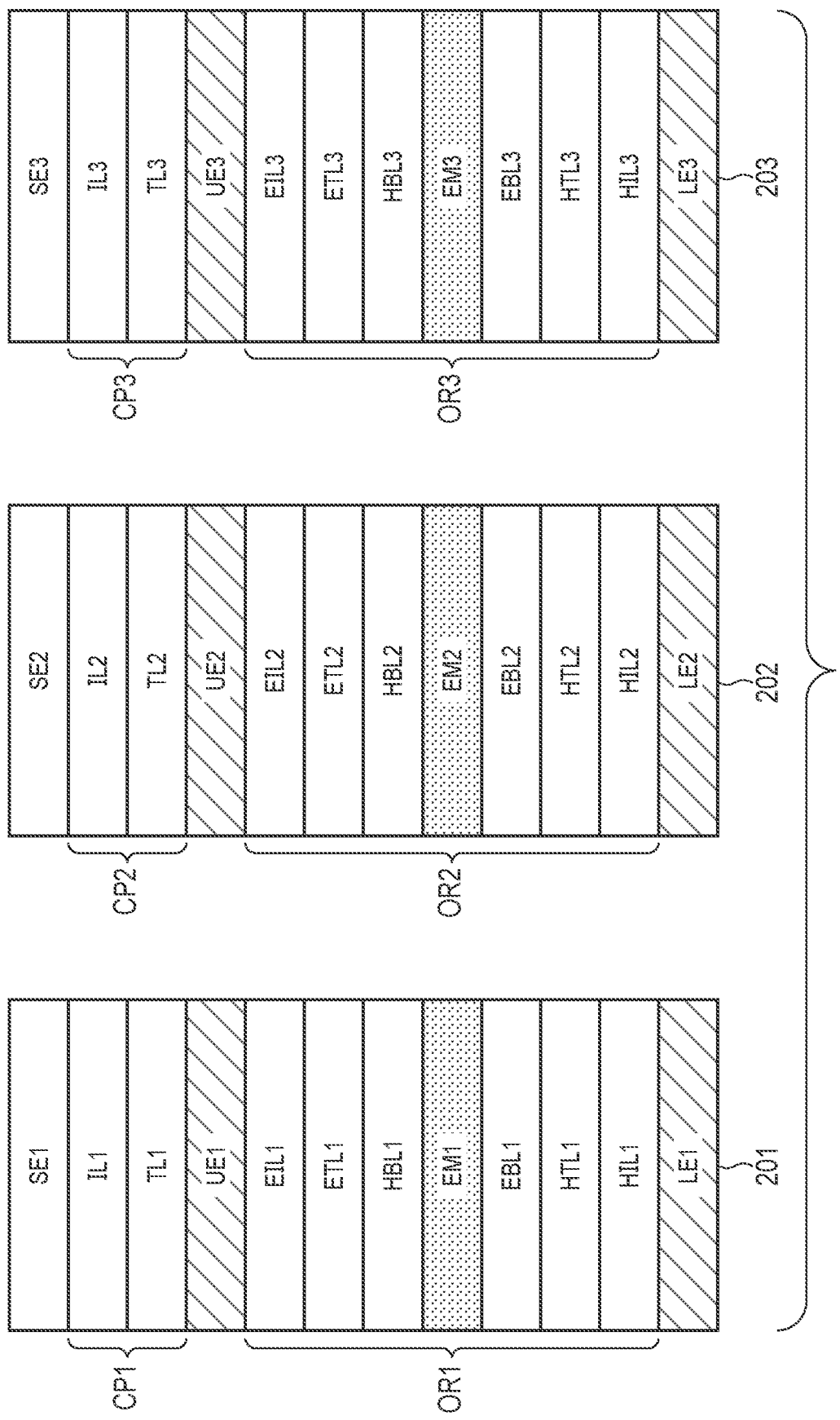
FIG. 4 is a diagram showing an example of the configurations of display elements 201 to 203.

FIG. 4 is a diagram showing an example of the configurations of the display elements 201 to 203. A case where the lower electrodes correspond to anodes and the upper electrodes correspond to cathodes is described here as an example.

The display element 201 includes the organic layer OR1 between the lower electrode LE1 and the upper electrode UE1.

In the organic layer OR1, a hole-injection layer HIL1, a hole-transport layer HTL1, an electron-blocking layer EBL1, the light-emitting layer EM1, a hole-blocking layer HBL1, an electron-transport layer ETL1, and an electron-injection layer EIL1 are stacked in this order.

The cap layer CP1 includes a transparent layer TL1 and an inorganic layer IL1. The transparent layer TL1 is disposed on the upper electrode UE1. The inorganic layer IL1 is disposed on the transparent layer TL1. The sealing layer SE1 is disposed on the inorganic layer IL1.

The display element 202 includes the organic layer OR2 between the lower electrode LE2 and the upper electrode UE2.

In the organic layer OR2, a hole-injection layer HIL2, a hole-transport layer HTL2, an electron-blocking layer EBL2, the light-emitting layer EM2, a hole-blocking layer HBL2, an electron-transport layer ETL2, and an electron-injection layer EIL2 are stacked in this order.

The cap layer CP2 includes a transparent layer TL2 and an inorganic layer IL2. The transparent layer TL2 is disposed on the upper electrode UE2. The inorganic layer IL2 is disposed on the transparent layer TL2. The sealing layer SE2 is disposed on the inorganic layer IL2.

The display element 203 includes the organic layer OR3 between the lower electrode LE3 and the upper electrode UE3.

In the organic layer OR3, a hole-injection layer HIL3, a hole-transport layer HTL3, an electron-blocking layer EBL3, the light-emitting layer EM3, a hole-blocking layer HBL3, an electron-transport layer ETL3, and an electron-injection layer EIL3 are stacked in this order.

The cap layer CP3 includes a transparent layer TL3 and an inorganic layer IL3. The transparent layer TL3 is disposed on the upper electrode UE3. The inorganic layer IL3 is disposed on the transparent layer TL3. The sealing layer SE3 is disposed on the inorganic layer IL3.

The transparent layers TL1, TL2, and TL3 are, for example, organic layers formed of organic materials, and are high-refractive-index layers having refractive indices greater than those of the upper electrodes UE1, UE2, and UE3. The inorganic layers IL1, IL2, and IL3 are, for example, transparent thin film formed of lithium fluoride (LiF), and are low-refractive-index layers having refractive indices less than those of the transparent layers TL1, TL2, and TL3.

The cap layers CP1, CP2, and CP3 may be a stacked layer body of three or more layers.

The organic layers OR1, OR2, and OR3 may include another functional layer such as a carrier generation layer as necessary in addition to the above-described functional layers, or at least one of the above-described functional layers may be omitted.

In addition, the above-described functional layers are individually formed for each of the display elements 201 to 203. Thus, the thickness of each of the above-described functional layers may differ between the display elements 201 to 203.

In addition, regarding the same functional layers, the same functional layer of one of the display elements 201 to 203 may be formed of a material different from those of the same functional layers of the other two display elements, or all the functional layers of the display elements 201 to 203 may be formed of materials different from each other.

Moreover, it is possible that the layered structure of one of the display elements 201 to 203 may be different from those of the other two display elements, or all the layered structures of the display elements 201 to 203 may be different from each other. For example, regarding one functional layer, one of the display elements 201 to 203 may not include this functional layer, or only one of the display elements 201 to 203 may include the functional layer. Furthermore, regarding one functional layer, for example, this functional layer may comprise a multilayer structure in one of the display elements 201 to 203.

The transparent layers TL1 to TL3 are separated from each other and are each individually formed. Thus, all of the transparent layers TL1 to TL3 may be formed of the same material, or one of the transparent layers TL1 to TL3 may be formed of a material different from that of the other two transparent layers, or all of the transparent layers TL1 to TL3 may be formed of materials different from each other. All of the thicknesses of the transparent layers TL1 to TL3 may be the same as each other, or may be different from each other.

The inorganic layers IL1 to IL3 are separated from each other and are each individually formed. Thus, all of the inorganic layers IL1 to IL3 may be formed of the same material, or one of the inorganic layers IL1 to IL3 may be formed of a material different from that of the other two inorganic layers, or all of the inorganic layers IL1 to IL3 may be formed of materials different from each other. All of the thicknesses of the inorganic layers IL1 to IL3 may be the same as each other, or may be different from each other.

All of the layer structures of the cap layers CP1 to CP3 may be the same as each other, or the layer structure of one of the cap layers CP1 to CP3 may be different from that of the other two cap layers, or all of the layer structures of the cap layers CP1 to CP3 may be different from each other.

In the example shown in FIG. 4, in the display element 201, the upper electrode UE1 and the inorganic layer IL1 function as etching stopper layers at the time of the dry etching of the sealing layer SE1. In the display element 202, the upper electrode UE2 and the inorganic layer IL2 function as etching stopper layers at the time of the dry etching of the sealing layer SE2. In the display element 203, the upper electrode UE3 and the inorganic layer IL3 function as etching stopper layers at the time of the dry etching of the sealing layer SE3.

When dry etching is performed to each of the etching stopper layer and the sealing layer on the same condition, and the etching rate of the etching stopper layer is compared with that of the sealing layer, the etching rates of the etching stopper layers (the upper electrode and the inorganic layer) are less than that of the sealing layer. In this configuration, when dry etching is performed for a stacked layer body in which the sealing layer is stacked on the etching stopper layer, while the sealing layer is removed, the progress of etching can be stopped in the etching stopper layer.

The upper electrodes UE1, UE2, and UE3, which function as etching stopper layers, are formed of a material different from that of the rib 5, and are formed of a material different from that of the sealing layers SE1, SE2, and SE3. For example, the rib 5 and the sealing layers SE1, SE2, and SE3 are formed of silicon nitride, whereas the upper electrodes UE1, UE2, and UE3 are formed of an alloy of magnesium and silver, which is a material having high resistance to dry etching compared to silicon nitride.

In addition, the inorganic layers IL1, IL2, and IL3, which function as etching stopper layers, are formed of a material different from that of the rib 5, and are formed of a material different from that of the sealing layers SE1, SE2, and SE3. For example, the rib 5 and the sealing layers SE1, SE2, and SE3 are formed of silicon nitride, whereas the inorganic layers IL1, IL2, and IL3 are formed of lithium fluoride, which is a material having high resistance to dry etching compared to silicon nitride.

FIG. 5 is a schematic cross-sectional view of the display device DSP along line C-D in FIG. 2. The cross-sectional view shown in FIG. 5 includes subpixels SP1 arranged in the second direction Y. In FIG. 5, the substrate, the circuit layer, and the protective layer shown in FIG. 3 are omitted.

Let us focus on the subpixel SP1 located in the center of the figure. In the Y-Z cross section defined by the second direction Y and the third direction Z, the lower part 61 of the partition 6 comprises a side surface S1A and a side surface S1B which are opposed to each other with the subpixel SP1 interposed therebetween. The side surface S1B is along a side at which the contact hole CH1 shown in FIG. 2 is provided of the subpixel SP1. Both end portions along the second direction Y of the organic layer OR1 are located on the rib 5 and are separated from the side surfaces S1A and S1B. That is, the rib 5 is exposed between the partition 6 and the organic layer OR1.

The upper electrode UE1 comprises an end portion UE1A and an end portion UE1B opposite to the end portion UE1A along the second direction Y. The end portion UE1A faces the side surface S1A, and the end portion UE1B faces the side surface S1B. The upper electrode UE1 covers the organic layer OR1 and covers the rib 5 between the organic layer OR1 and the partition 6. In the example shown in the figure, the upper electrode UE1 is in contact with the side surfaces S1A and S1B. Note that the contact area between the upper electrode UE1 and the side surface S1B is larger than the contact area between the upper electrode UE1 and the side surface S1A.

The cap layer CP1 is disposed on the upper electrode UE1. Of the cap layer CP1, at least the inorganic layer IL1 covers the end portion UE1A of the upper electrode UE1 and is in contact with the side surface S1A. In the example shown in the figure, the inorganic layer IL1 exposes the end portion UE1B of the upper electrode UE1 and is separated from the side surface S1B. The end portion UE1B is covered by the sealing layer SE1.

The contact area between the side surface S1A and the inorganic layer IL1 is larger than the contact area between the side surface S1A and the upper electrode UE1. In addition, the contact area between the side surface S1B and the upper electrode UE1 is larger than the contact area between the side surface S1B and the inorganic layer IL1.

In this manner, in the space between the organic layer OR1 and the partition 6, at least one of the upper electrode UE1 and the inorganic layer IL1 is interposed between the rib 5 and the sealing layer SE1.

In the example shown in FIG. 5, for example, the end portion UE1A corresponds to a first end portion, the end portion UE1B corresponds to a second end portion, the side surface S1A corresponds to a first side surface, and the side surface S1B corresponds to a second side surface.

Figure 6:
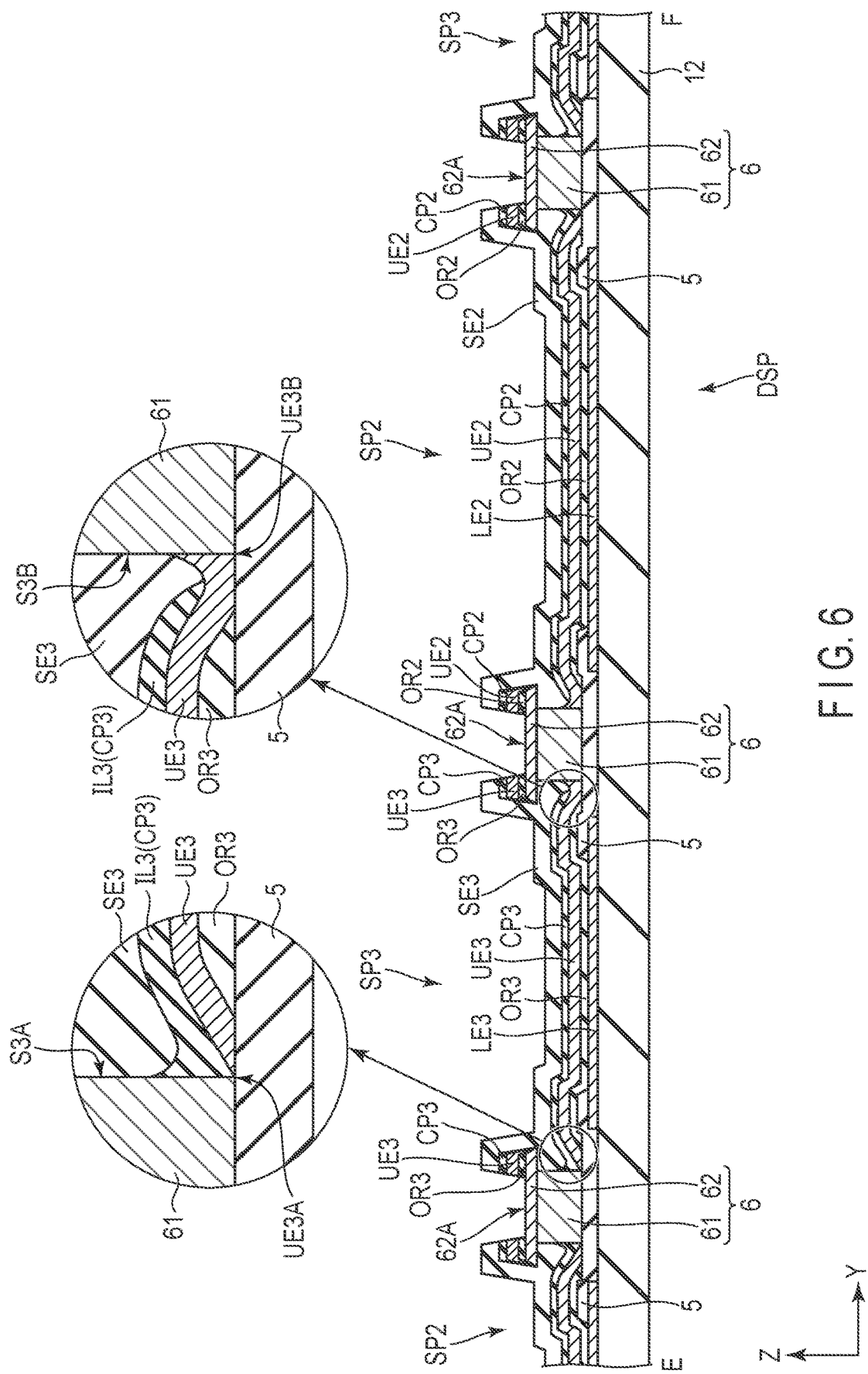
FIG. 6 is a schematic cross-sectional view of the display device DSP along line E-F in FIG. 2.

FIG. 6 is a schematic cross-sectional view of the display device DSP along line E-F in FIG. 2. The cross-sectional view shown in FIG. 6 includes subpixels SP2 and subpixels SP3 alternately arranged in the second direction Y. In FIG. 6, the substrate, the circuit layer, and the protective layer shown in FIG. 3 are omitted.

Let us focus on the subpixel SP3 located on the left side of the figure. In the Y-Z cross section, the lower part 61 of the partition 6 comprises a side surface S3A and a side surface S3B which are opposed to each other with the subpixel SP3 interposed therebetween. The side surface S3B is along a side at which the contact hole CH3 shown in FIG. 2 is provided of the subpixel SP3. Both end portions along the second direction Y of the organic layer OR3 are located on the rib 5 and are separated from the side surfaces S3A and S3B. That is, the rib 5 is exposed between the partition 6 and the organic layer OR3.

The upper electrode UE3 comprises an end portion UE3A and an end portion UE3B opposite to the end portion UE3A along the second direction Y. The end portion UE3A faces the side surface S3A, and the end portion UE3B faces the side surface S3B. The upper electrode UE3 covers the organic layer OR3 and covers the rib 5 between the organic layer OR3 and the partition 6. In the example shown in the figure, the upper electrode UE3 is in contact with the side surfaces S3A and S3B. Note that the contact area between the upper electrode UE3 and the side surface S3B is larger than the contact area between the upper electrode UE3 and the side surface S3A.

The cap layer CP3 is disposed on the upper electrode UE3. Of the cap layer CP3, at least the inorganic layer IL3 covers the end portion UE3A of the upper electrode UE3 and is in contact with the side surface S3A. In the example shown in the figure, the inorganic layer IL3 exposes the end portion UE3B of the upper electrode UE3, and is separated from the side surface S3B. The end portion UE3B is covered by the sealing layer SE3.

The contact area between the side surface S3A and the inorganic layer IL3 is larger than the contact area between the side surface S3A and the upper electrode UE3. In addition, the contact area between the side surface S3B and the upper electrode UE3 is larger than the contact area between the side surface S3B and the inorganic layer IL3.

In this manner, in the space between the organic layer OR3 and the partition 6, at least one of the upper electrode UE3 and the inorganic layer IL3 is interposed between the rib 5 and the sealing layer SE1.

Let us focus on the subpixel SP2 located on the right side of the figure. Both end portions along the second direction Y of the organic layer OR2 are located on the rib 5 and are separated from the partition 6.

The upper electrode UE2 covers the organic layer OR2, and the cap layer CP2 is disposed on the upper electrode UE2. The upper electrode UE2 is in contact with the partition 6 in the center of the figure, and at least the inorganic layer IL2 (omitted in the figure) of the cap layer CP2 is in contact with the partition 6 on the right side of the figure.

In this manner, in the space between the organic layer OR2 and the partition 6, at least one of the upper electrode UE2 and the inorganic layer IL2 is interposed between the rib 5 and the sealing layer SE2.

An evaporation device for forming an etching stopper layer will be described next.

Figure 7:
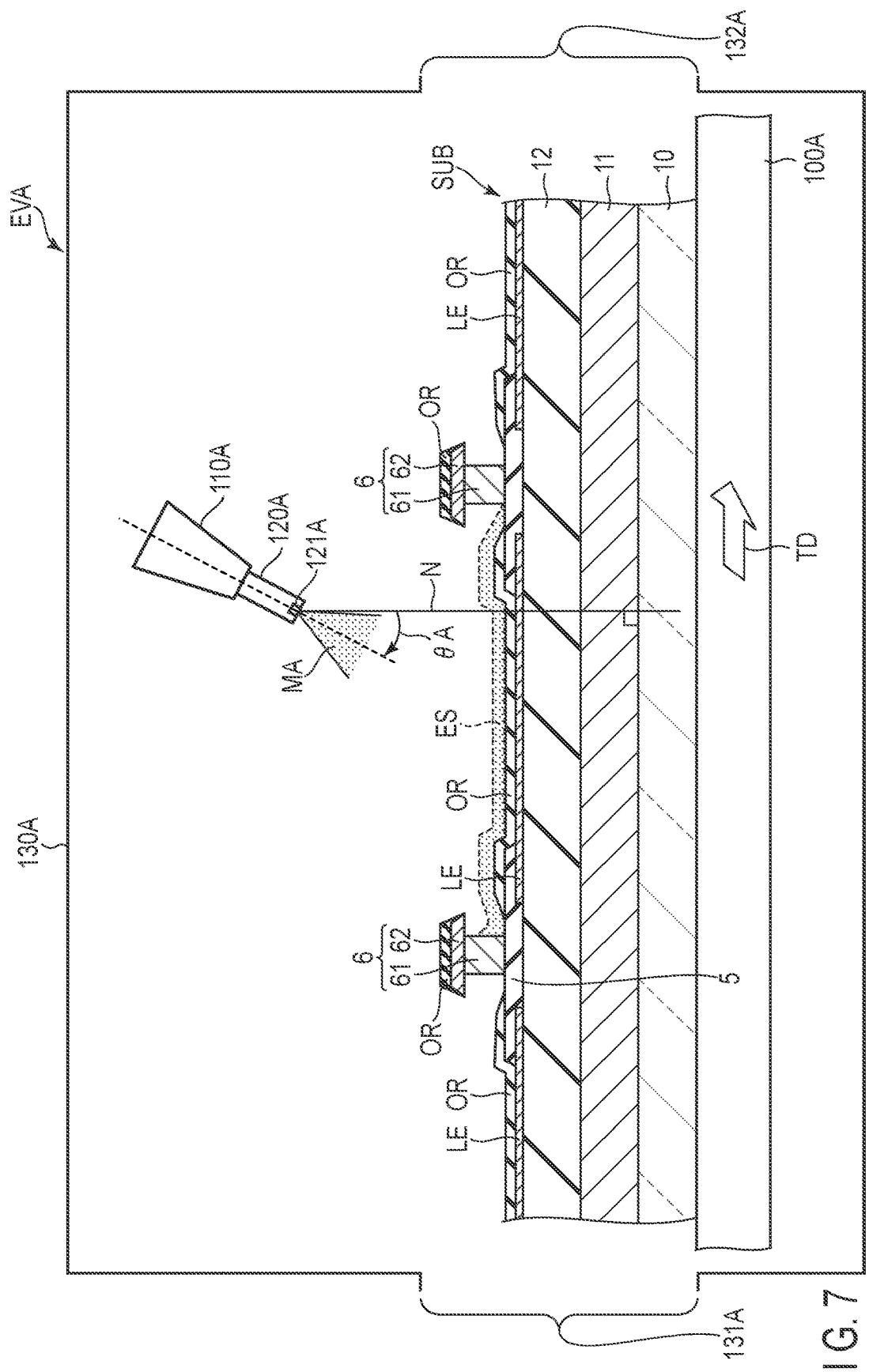
FIG. 7 is a diagram for explaining an evaporation device EVA.

FIG. 7 is a diagram for explaining an evaporation device EVA.

The evaporation device EVA comprises a conveyance mechanism 100A, an evaporation source 110A, and a chamber 130A. The chamber 130A comprises an entrance 131A for carrying a processing substrate SUB thereinto and an exit 132A for carrying out the processing substrate SUB. A manufacturing device of a display device described in the present specification is a device of an in-line system, in which the entrance 131A is connected to another evaporation device and the exit 132A is connected to yet another evaporation device.

The conveyance mechanism 100A is configured to convey the processing substrate SUB. The processing substrate SUB here is, for example, prepared by forming the circuit layer 11, the insulating layer 12, lower electrodes LE, the rib 5, the partition 6, and organic layers OR above the substrate 10. The conveyance mechanism 100A conveys the processing substrate SUB from the entrance 131A to the exit 132A. The conveyance direction TD of the processing substrate SUB is, for example, parallel to the second direction Y in the above-described display device DSP.

The evaporation source 110A is configured to emit a material MA for forming an etching stopper layer ES. The evaporation source 110A is accommodated in the chamber 130A and is fixed to the chamber 130A by a securing tool not shown in the figure. The evaporation source 110A comprises a nozzle 120A which controls the emission direction of the material MA. At the tip of the nozzle 120A, a discharge port 121A is formed. The above-described evaporation source 110A is inclined with respect to a normal N of the processing substrate SUB (or a normal of the substrate 10).

The evaporation source 110A shown in the figure is inclined to the right side of the figure with respect to the normal N. At this time, the discharge port 121A faces toward the entrance 131A side. That is, the evaporation source 110A emits the material MA in the direction opposite to the arrow of the conveyance direction TD of the processing substrate SUB. An inclination angle θA of the evaporation source 110A can be defined as an angle formed by the normal N of the processing substrate SUB and the extension direction of the nozzle 120A in the cross section defined by the conveyance direction TD of the processing substrate SUB and the normal N of the processing substrate SUB. The inclination angle θA of the evaporation source 110A is a clockwise acute angle with respect to the normal N. For example, the inclination angle θA is greater than or equal to 5° but less than or equal to 40°.

In the above-described evaporation device EVA, the processing substrate SUB carried into the chamber 130A through the entrance 131A is subjected to the following processing.

First, the emission of the material MA from the evaporation source 110A starts. Then, while the conveyance mechanism 100A conveys the processing substrate SUB, the material MA emitted from the evaporation source 110A is deposited onto the processing substrate SUB. At this time, the material MA emitted from the evaporation source 110A is deposited on the organic layer OR, and reaches the lower part 61 of the partition 6 on the left side in the figure. In this way, the etching stopper layer ES having a cross section indicated by a broken line is formed, and the rib 5 between the organic layer OR and the partition 6 is covered by the etching stopper layer ES.

Figure 8:
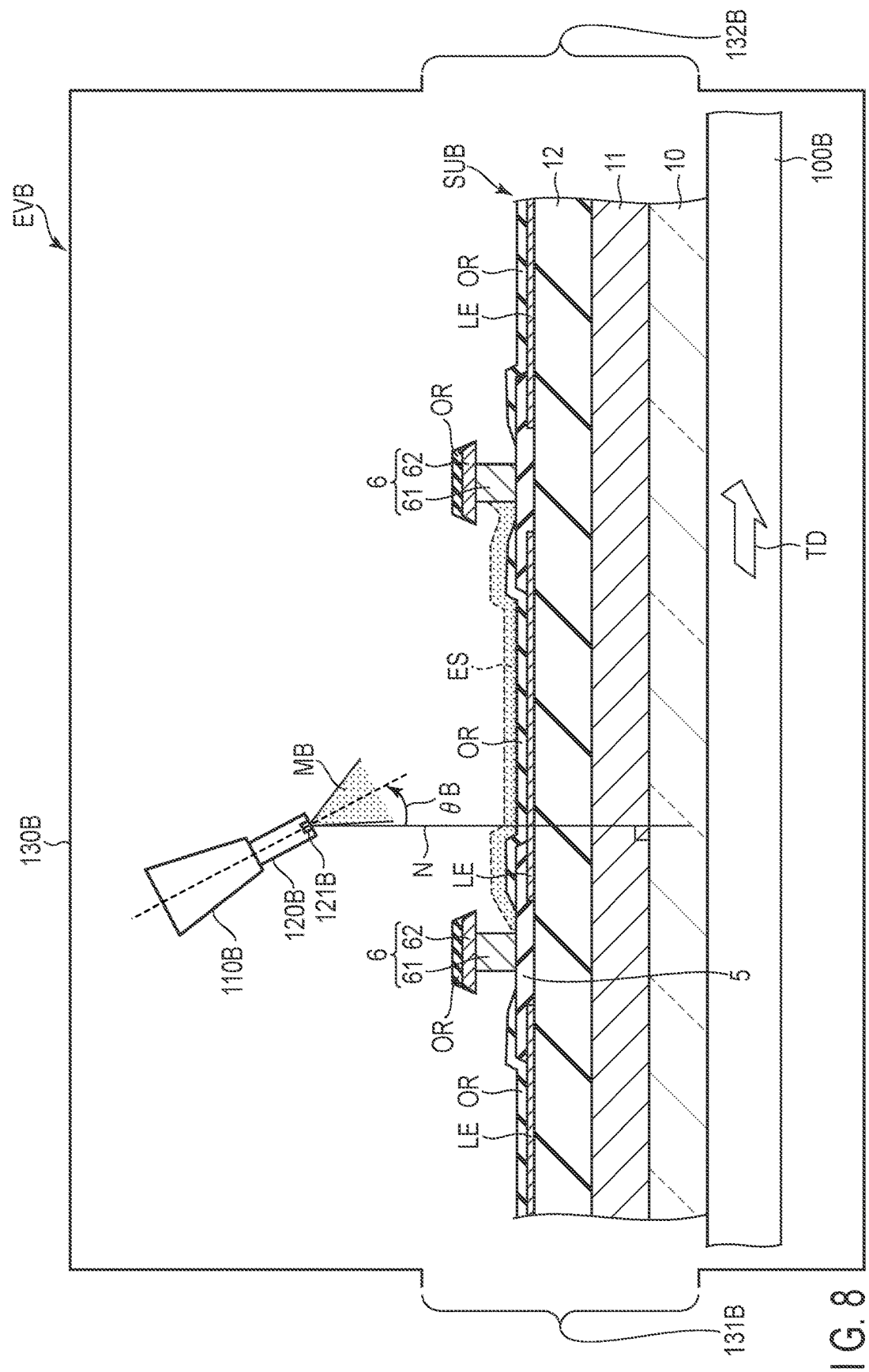
FIG. 8 is a diagram for explaining an evaporation device EVB.

FIG. 8 is a diagram for explaining an evaporation device EVB.

The evaporation device EVB comprises a conveyance mechanism 100B, an evaporation source 110B, and a chamber 130B. The chamber 130B comprises an entrance 131B for carrying the processing substrate SUB thereinto and an exit 132B for carrying out the processing substrate SUB.

The evaporation device EVB shown in FIG. 8 is different from the evaporation device EVA shown in FIG. 7 in that the evaporation source 110B is inclined to the side opposite to the side to which the evaporation source 110A is inclined with respect to the normal N of the processing substrate SUB.

The evaporation source 110B is configured to emit a material MB for forming the etching stopper layer ES. The evaporation source 110B is accommodated in the chamber 130B and is fixed to the chamber 130B by a securing tool not shown in the figure. The evaporation source 110B comprises a nozzle 120B which controls the emission direction of the material MB. At the tip of the nozzle 120B, a discharge port 121B is formed.

The evaporation source 110B shown in the figure is inclined to the left side of the figure with respect to the normal N. At this time, the discharge port 121B faces toward the exit 132B side. That is, the evaporation source 110B emits the material MB in the direction of the arrow of the conveyance direction TD of the processing substrate SUB. An inclination angle θB of the evaporation source 110B can be defined as an angle formed by the normal N of the processing substrate SUB and the extension direction of the nozzle 120B in the cross section defined by the conveyance direction TD of the processing substrate SUB and the normal N of the processing substrate SUB. The inclination angle θB of the evaporation source 110B is a counterclockwise acute angle with respect to the normal N. For example, the inclination angle θB is greater than or equal to 5° but less than or equal to 40°.

In the above-described evaporation device EVB, the processing substrate SUB carried into the chamber 130B through the entrance 131B is subjected to the following processing.

First, the emission of the material MB from the evaporation source 110B starts. Then, while the conveyance mechanism 100B conveys the processing substrate SUB, the material MB emitted from the evaporation source 110B is deposited onto the processing substrate SUB. At this time, the material MB emitted from the evaporation source 110B is deposited on the organic layer OR, and reaches the lower part 61 of the partition 6 on the right side in the figure. In this way, the etching stopper layer ES having a cross section indicated by a broken line is formed, and the rib 5 between the organic layer OR and the partition 6 is covered by the etching stopper layer ES.

Figure 9:
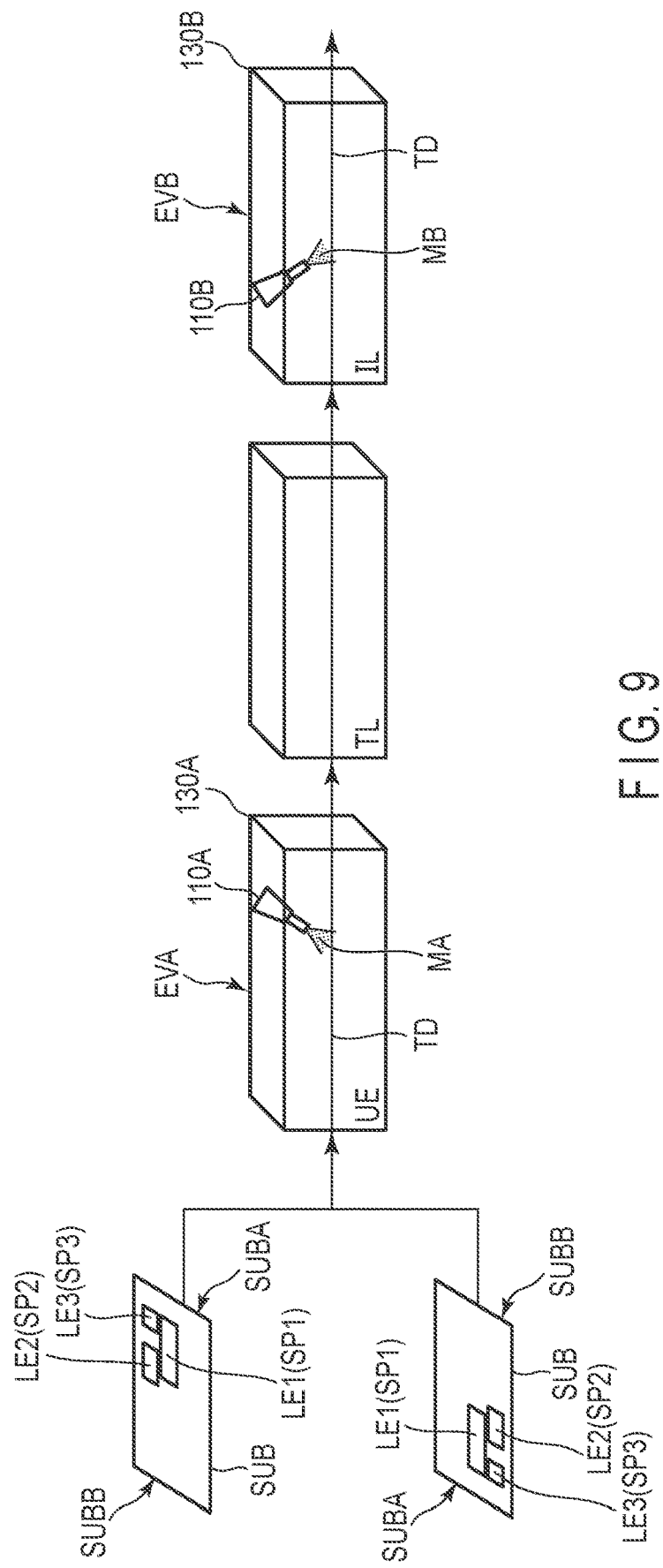
FIG. 9 is a diagram for explaining a manufacturing method of forming an upper electrode UE and an inorganic layer IL.

FIG. 9 is a diagram for explaining a manufacturing method of forming an upper electrode UE and an inorganic layer IL.

In the example shown in the figure, the evaporation device EVA shown in FIG. 7 comprises the evaporation source 110A which corresponds to a first evaporation source, and is located on the upstream side in the conveyance direction TD. In addition, the evaporation device EVB shown in FIG. 8 comprises the evaporation source 110B which corresponds to a second evaporation source, and is located on the downstream side in the conveyance direction TD. As described above, the evaporation source 110A and the evaporation source 110B are each inclined and are inclined to the opposite sides.

The upper electrode UE is formed in the evaporation device EVA, and the inorganic layer IL is formed in the evaporation device EVB. Between the evaporation device EVA and the evaporation device EVB, a transparent layer TL is formed. That is, the material MA emitted from the evaporation source 110A is a mixture of magnesium and silver, and the material MB emitted from the evaporation source 110B is lithium fluoride.

The processing substrate SUB comprises one end SUBA and the other end SUBB opposed to each other along the direction in which the subpixels SP2 and SP3 are arranged. The conveyance direction TD of the processing substrate SUB is parallel to the direction in which the subpixels SP2 and SP3 are arranged.

When the upper electrode UE1, the transparent layer TL1, and the inorganic layer IL1 of the subpixel SP1 are formed, the processing substrate SUB is conveyed such that the one end SUBA is the head. First, the upper electrode UE1 is formed in the evaporation device EVA. Then, after the transparent layer TL1 is formed, the inorganic layer IL1 is formed in the evaporation device EVB.

Also when the upper electrode UE3, the transparent layer TL3, and the inorganic layer IL3 of the subpixel SP3 are formed, the processing substrate SUB is conveyed such that the one end SUBA is the head.

When the upper electrode UE2, the transparent layer TL2, and the inorganic layer IL2 of the subpixel SP2 are formed, the processing substrate SUB is conveyed such that the other end SUBB is the head. First, the upper electrode UE2 is formed in the evaporation device EVA. Then, after the transparent layer TL2 is formed, the inorganic layer IL2 is formed in the evaporation device EVB.

Figure 10:
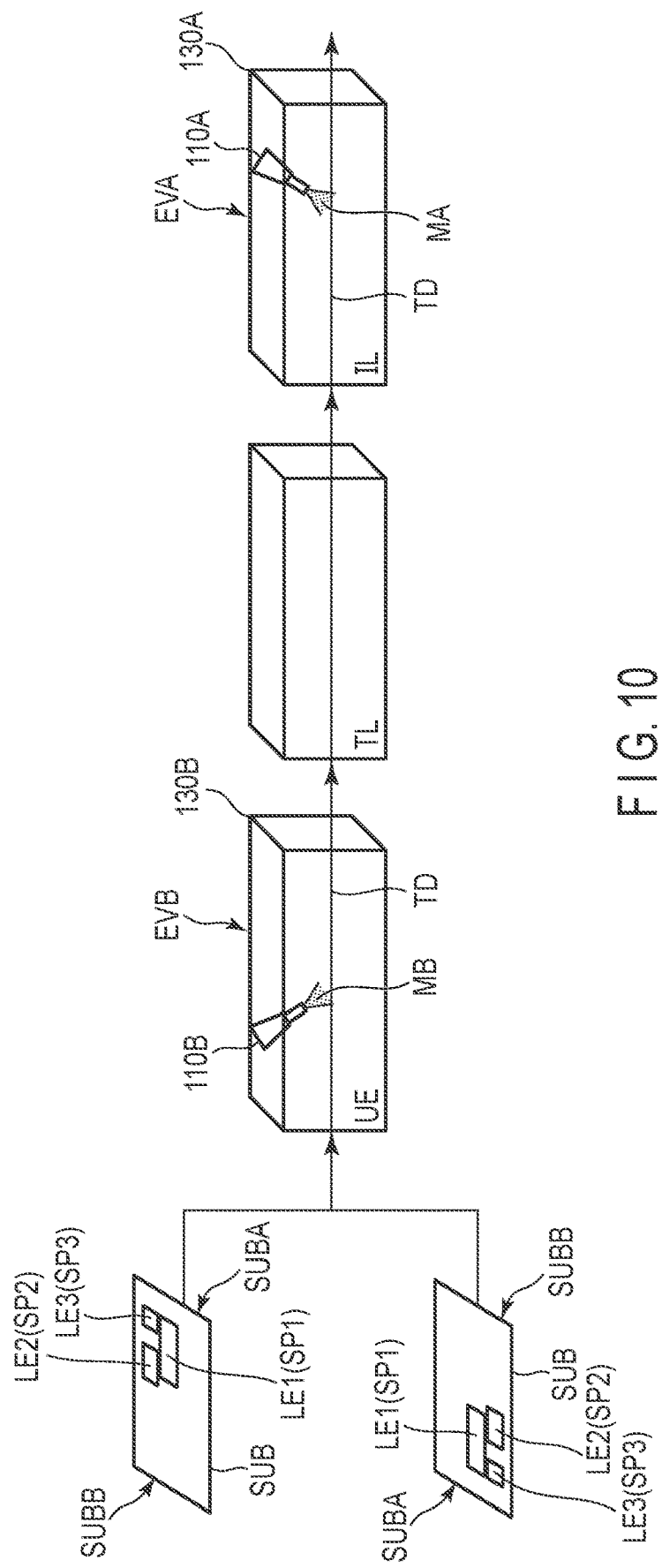
FIG. 10 is a diagram for explaining another manufacturing method of forming the upper electrode UE and the inorganic layer IL.

FIG. 10 is a diagram for explaining another manufacturing method of forming the upper electrode UE and the inorganic layer IL.

In the example shown in the figure, the evaporation device EVB shown in FIG. 8 comprises the evaporation source 110B which corresponds to a first evaporation source, and is located on the upstream side in the conveyance direction TD. In addition, the evaporation device EVA shown in FIG. 7 comprises the evaporation source 110A which corresponds to a second evaporation source, and is located on the downstream side in the conveyance direction TD. The upper electrode UE is formed in the evaporation device EVB, and the inorganic layer IL is formed in the evaporation device EVA. That is, the material MB emitted from the evaporation source 110B is a mixture of magnesium and silver, and the material MA emitted from the evaporation source 110A is lithium fluoride.

When the upper electrode UE1, the transparent layer TL1, and the inorganic layer IL1 of the subpixel SP1 are formed, the processing substrate SUB is conveyed such that the other end SUBB is the head. First, the upper electrode UE1 is formed in the evaporation device EVB. Then, after the transparent layer TL1 is formed, the inorganic layer IL1 is formed in the evaporation device EVA.

Also when the upper electrode UE3, the transparent layer TL3, and the inorganic layer IL3 of the subpixel SP3 are formed, the processing substrate SUB is conveyed such that the other end SUBB is the head.

When the upper electrode UE2, the transparent layer TL2, and the inorganic layer IL2 of the subpixel SP2 are formed, the processing substrate SUB is conveyed such that the one end SUBA is the head. First, the upper electrode UE2 is formed in the evaporation device EVB. Then, after the transparent layer TL2 is formed, the inorganic layer IL2 is formed in the evaporation device EVA.

The evaporation devices EVA and EVB of the examples shown in FIG. 7 to FIG. 10 correspond to evaporation devices configured to convey the processing substrate SUB in a state where an evaporation surface of the processing substrate SUB is located above the substrate 10 (face-up) and to emit the materials MA and MB downward from the evaporation sources 110A and 110B. However, the evaporation devices EVA and EVB are not limited to this case. For example, the evaporation devices EVA and EVB may be configured to convey the processing substrate SUB in a state where the evaporation surface of the processing substrate SUB is located below the substrate 10 (face-down) and to emit the materials MA and MB upward from the evaporation sources 110A and 110B. In addition, the evaporation devices EVA and EVB may be configured to convey the processing substrate SUB in a state where the processing substrate SUB stands perpendicularly to a horizontal plane and to emit the materials MA and MB laterally from the evaporation sources 110A and 110B.

An example of a manufacturing method of the display device DSP will be described next.

Figure 11:
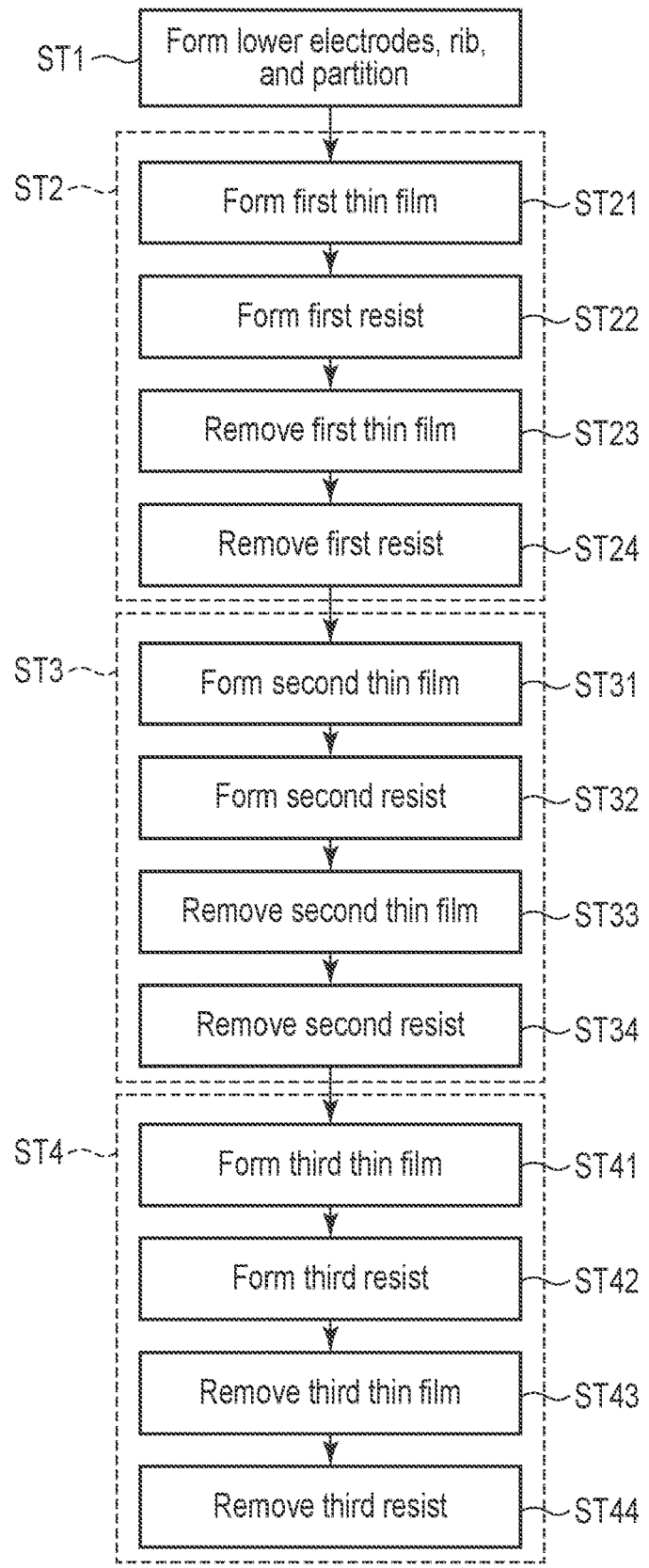
FIG. 11 is a flowchart for explaining an example of a manufacturing method of the display device DSP.

FIG. 11 is a flowchart for explaining an example of the manufacturing method of the display device DSP.

The manufacturing method described here broadly includes the step of preparing the processing substrate SUB comprising the subpixel SP1, the subpixel SP2, and the subpixel SP3 (step ST1), the step of forming the display element 201 of the subpixel SP1 (step ST2), the step of forming the display element 202 of the subpixel SP2 (step ST3), and the step of forming the display element 203 of the subpixel SP3 (step ST4).

In step ST1, first, the processing substrate SUB is prepared by forming the lower electrode LE1 of the subpixel SP1, the lower electrode LE2 of the subpixel SP2, the lower electrode LE3 of the subpixel SP3, the rib 5, and the partition 6, above the substrate 10. As shown in FIG. 3, the circuit layer 11 and the insulating layer 12 are also formed between the substrate 10 and the lower electrodes LE1, LE2, and LE3.

In step ST2, first, a first thin film 31 including the light-emitting layer EM1 is formed over the subpixel SP1, the subpixel SP2, and the subpixel SP3 (step ST21). Then, a first resist 41 patterned with a predetermined shape is formed on the first thin film 31 (step ST22). Then, part of the first thin film 31 is removed by performing etching with the first resist 41 used as a mask (step ST23). Then, the first resist 41 is removed (step ST24). The subpixel SP1 is thereby formed. The subpixel SP1 comprises the display element 201 including the first thin film 31 of a predetermined shape.

In step ST3, first, a second thin film 32 including the light-emitting layer EM2 is formed over the subpixel SP1, the subpixel SP2, and the subpixel SP3 (step ST31). Then, a second resist 42 patterned with a predetermined shape is formed on the second thin film 32 (step ST32). Then, part of the second thin film 32 is removed by performing etching with the second resist 42 used as a mask (step ST33). Then, the second resist 42 is removed (step ST34). The subpixel SP2 is thereby formed. The subpixel SP2 comprises the display element 202 including the second thin film 32 of a predetermined shape.

In step ST4, first, a third thin film 33 including the light-emitting layer EM3 is formed over the subpixel SP1, the subpixel SP2, and the subpixel SP3 (step ST41). Then, a third resist 43 patterned with a predetermined shape is formed on the third thin film 33 (step ST42). Then, part of the third thin film 33 is removed by performing etching with the third resist 43 used as a mask (step ST43). Then, the third resist 43 is removed (step ST44). The subpixel SP3 is thereby formed. The subpixel SP3 comprises the display element 203 including the third thin film 33 of a predetermined shape.

Note that the detailed illustration of the second thin film 32, the second resist 42, the third thin film 33, and the third resist 43 is omitted.

Figure 12:
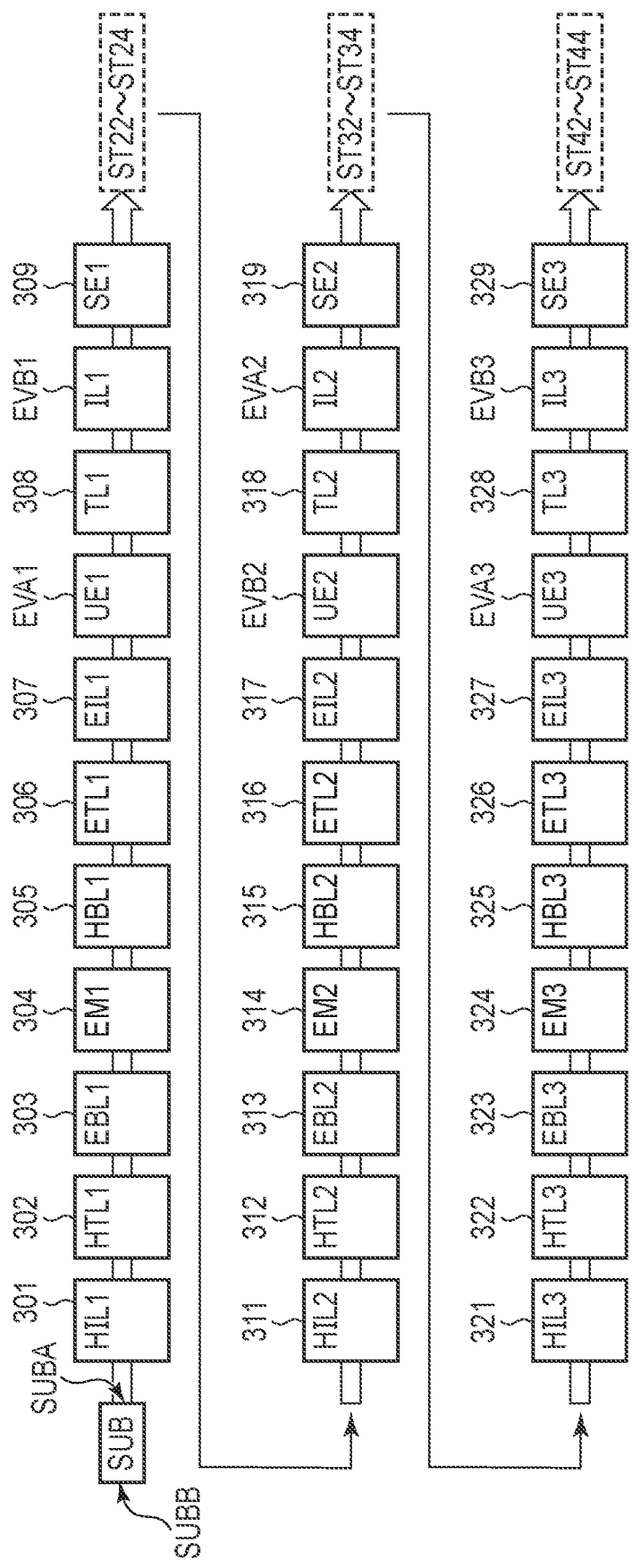
FIG. 12 is a diagram showing an example of a manufacturing device applicable to the step of forming a first thin film 31, the step of forming a second thin film 32, and the step of forming a third thin film 33.

FIG. 12 is a diagram showing an example of a manufacturing device applicable to the step of forming the first thin film 31, the step of forming the second thin film 32, and the step of forming the third thin film 33.

The processing substrate SUB prepared through step ST1 is conveyed such that the one end SUBA is the head.

First, the processing substrate SUB is carried into an evaporation device 301. In the evaporation device 301, the hole-injection layer HIL1 is formed.

Then, in an evaporation device 302, the hole-transport layer HTL1 is formed.

Then, in an evaporation device 303, the electron-blocking layer EBL1 is formed.

Then, in an evaporation device 304, the light-emitting layer EM1 is formed.

Then, in an evaporation device 305, the hole-blocking layer HBL1 is formed.

Then, in an evaporation device 306, the electron-transport layer ETL1 is formed.

Then, in an evaporation device 307, the electron-injection layer EIL1 is formed. The organic layer OR1 is thereby formed.

Then, in an evaporation device EVA1 shown in FIG. 9, the upper electrode UE1 is formed.

Then, in an evaporation device 308, the transparent layer TL1 is formed.

Then, in an evaporation device EVB1 shown in FIG. 9, the inorganic layer IL1 is formed. The cap layer CP1 is thereby formed.

Then, in a chemical-vapor deposition (CVD) device 309, the sealing layer SE1 is formed.

Then, after steps ST22 to ST24 shown in FIG. 11 are carried out, the processing substrate SUB is carried into an evaporation device 311 such that the one end SUBA is the head. In the evaporation device 311, the hole-injection layer HIL2 is formed.

Then, in an evaporation device 312, the hole-transport layer HTL2 is formed.

Then, in an evaporation device 313, the electron-blocking layer EBL2 is formed.

Then, in an evaporation device 314, the light-emitting layer EM2 is formed.

Then, in an evaporation device 315, the hole-blocking layer HBL2 is formed.

Then, in an evaporation device 316, the electron-transport layer ETL2 is formed.

Then, in an evaporation device 317, the electron-injection layer EIL2 is formed. The organic layer OR2 is thereby formed.

Then, in an evaporation device EVB2 shown in FIG. 10, the upper electrode UE2 is formed.

Then, in an evaporation device 318, the transparent layer TL2 is formed.

Then, in an evaporation device EVA2 shown in FIG. 10, the inorganic layer IL2 is formed. The cap layer CP2 is thereby formed.

Then, in a CVD device 319, the sealing layer SE2 is formed.

Then, after steps ST32 to ST34 shown in FIG. 11 are carried out, the processing substrate SUB is carried into an evaporation device 321 such that the one end SUBA is the head. In the evaporation device 321, the hole-injection layer HIL3 is formed.

Then, in an evaporation device 322, the hole-transport layer HTL3 is formed.

Then, in an evaporation device 323, the electron-blocking layer EBL3 is formed.

Then, in an evaporation device 324, the light-emitting layer EM3 is formed.

Then, in an evaporation device 325, the hole-blocking layer HBL3 is formed.

Then, in an evaporation device 326, the electron-transport layer ETL3 is formed.

Then, in an evaporation device 327, the electron-injection layer EIL3 is formed. The organic layer OR3 is thereby formed.

Then, in an evaporation device EVA3 shown in FIG. 9, the upper electrode UE3 is formed.

Then, in an evaporation device 328, the transparent layer TL3 is formed.

Then, in an evaporation device EVB3 shown in FIG. 9, the inorganic layer IL3 is formed. The cap layer CP3 is thereby formed.

Then, in a CVD device 329, the sealing layer SE3 is formed.

Then, steps ST42 to ST44 shown in FIG. 11 are carried out.

The combination of the evaporation device EVA1 and the evaporation device EVB1 and the combination of the evaporation device EVA3 and the evaporation device EVB3 are equivalent to the combination of the evaporation device EVA and the evaporation device EVB shown in FIG. 9.

The combination of the evaporation device EVB2 and the evaporation device EVA2 is equivalent to the combination of the evaporation device EVB and the evaporation device EVA shown in FIG. 10.

Figure 13:
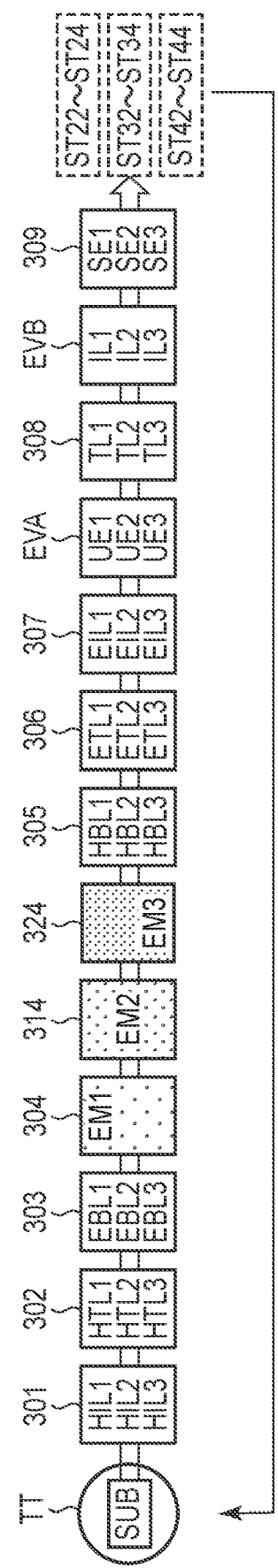
FIG. 13 is a diagram showing another example of the manufacturing device applicable to the step of forming the first thin film 31, the step of forming the second thin film 32, and the step of forming the third thin film 33.

FIG. 13 is a diagram showing another example of the manufacturing device applicable to the step of forming the first thin film 31, the step of forming the second thin film 32, and the step of forming the third thin film 33.

The processing substrate SUB prepared through step ST1 is disposed on a turntable TT, is disposed such that the one end SUBA is the head, and is conveyed.

First, the processing substrate SUB is carried into the evaporation device 301. In the evaporation device 301, the hole-injection layer HIL1 is formed.

Then, in the evaporation device 302, the hole-transport layer HTL1 is formed.

Then, in the evaporation device 303, the electron-blocking layer EBL1 is formed.

Then, in the evaporation device 304, the light-emitting layer EM1 is formed. The evaporation devices 314 and 324 cause the processing substrate SUB to pass though without emitting any materials.

Then, in the evaporation device 305, the hole-blocking layer HBL1 is formed.

Then, in the evaporation device 306, the electron-transport layer ETL1 is formed.

Then, in the evaporation device 307, the electron-injection layer EIL1 is formed. The organic layer OR1 is thereby formed.

Then, in the evaporation device EVA shown in FIG. 9, the upper electrode UE1 is formed.

Then, in the evaporation device 308, the transparent layer TL1 is formed.

Then, in the evaporation device EVB shown in FIG. 9, the inorganic layer IL1 is formed. The cap layer CP1 is thereby formed.

Then, in the CVD device 309, the sealing layer SE1 is formed.

Then, after steps ST22 to ST24 shown in FIG. 11 are carried out, the processing substrate SUB is disposed on the turntable TT, is disposed such that the other end SUBB is the head, and is conveyed.

Then, the processing substrate SUB is carried into the evaporation device 301 again. In the evaporation device 301, the hole-injection layer HIL2 is formed.

Then, in the evaporation device 302, the hole-transport layer HTL2 is formed.

Then, in the evaporation device 303, the electron-blocking layer EBL2 is formed.

Then, in the evaporation device 314, the light-emitting layer EM2 is formed. The evaporation devices 304 and 324 cause the processing substrate SUB to pass though without emitting any materials.

Then, in the evaporation device 305, the hole-blocking layer HBL2 is formed.

Then, in the evaporation device 306, the electron-transport layer ETL2 is formed.

Then, in the evaporation device 307, the electron-injection layer EIL2 is formed. The organic layer OR2 is thereby formed.

Then, in the evaporation device EVA, the upper electrode UE2 is formed.

Then, in the evaporation device 308, the transparent layer TL2 is formed.

Then, in the evaporation device EVB, the inorganic layer IL2 is formed. The cap layer CP2 is thereby formed.

Then, in the CVD device 309, the sealing layer SE2 is formed.

Then, after steps ST32 to ST34 shown in FIG. 11 are carried out, the processing substrate SUB is disposed on the turntable TT, is disposed such that the one end SUBA is the head, and is conveyed.

Then, the processing substrate SUB is carried into the evaporation device 301 again. In the evaporation device 301, the hole-injection layer HIL3 is formed.

Then, in the evaporation device 302, the hole-transport layer HTL3 is formed.

Then, in the evaporation device 303, the electron-blocking layer EBL3 is formed.

Then, in the evaporation device 324, the light-emitting layer EM3 is formed. The evaporation devices 304 and 314 cause the processing substrate SUB to pass though without emitting any materials.

Then, in the evaporation device 305, the hole-blocking layer HBL3 is formed.

Then, in the evaporation device 306, the electron-transport layer ETL3 is formed.

Then, in the evaporation device 307, the electron-injection layer EIL3 is formed. The organic layer OR3 is thereby formed.

Then, in the evaporation device EVA, the upper electrode UE3 is formed.

Then, in the evaporation device 308, the transparent layer TL3 is formed.

Then, in the evaporation device EVB, the inorganic layer IL3 is formed. The cap layer CP3 is thereby formed.

Then, in the CVD device 309, the sealing layer SE3 is formed.

Then, steps ST42 to ST44 shown in FIG. 11 are carried out.

Step ST1 and step ST2 will be described hereinafter with reference to FIG. 14 to FIG. 20. Each of the cross sections shown in FIG. 14, FIG. 15, FIG. 17, FIG. 18, and FIG. 20 corresponds to, for example, a cross section along A-B in FIG. 2.

Figure 14:
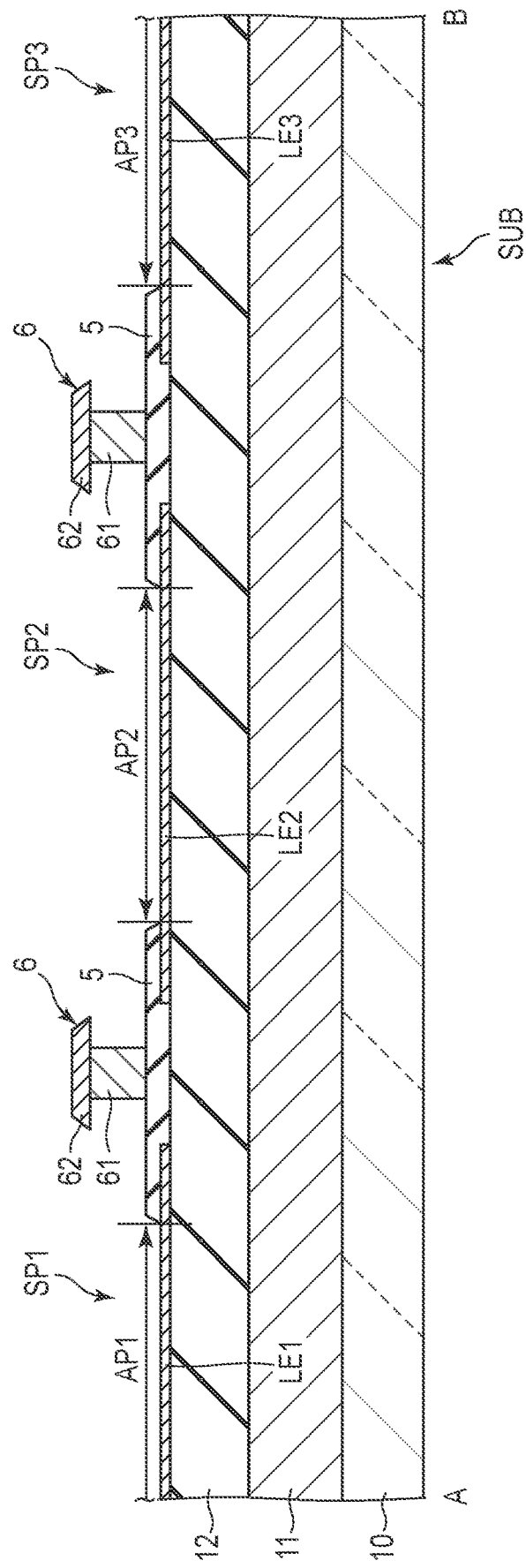
FIG. 14 is a diagram for explaining the manufacturing method of the display device DSP.

First, in step ST1, as shown in FIG. 14, the processing substrate SUB is prepared. The step of preparing the processing substrate SUB includes: the step of forming the circuit layer 11 on the substrate 10; the step of forming the insulating layer 12 on the circuit layer 11; the step of forming the lower electrode LE1 of the subpixel SP1, the lower electrode LE2 of the subpixel SP2, and the lower electrode LE3 of the subpixel SP3 on the insulating layer 12; the step of forming the rib 5 comprising the apertures AP1, AP2, and AP3 overlapping the lower electrodes LE1, LE2, and LE3, respectively; and the step of forming the partition 6 including the lower part 61 disposed on the rib 5 and the upper part 62 disposed on the lower part 61 and projecting from the side surfaces of the lower part 61. In each of FIG. 15, FIG. 17, FIG. 18, and FIG. 20, the illustration of the substrate 10 and the circuit layer 11, which are lower than the insulating layer 12, is omitted.

The rib 5 is formed of, for example, silicon nitride.

Figure 15:
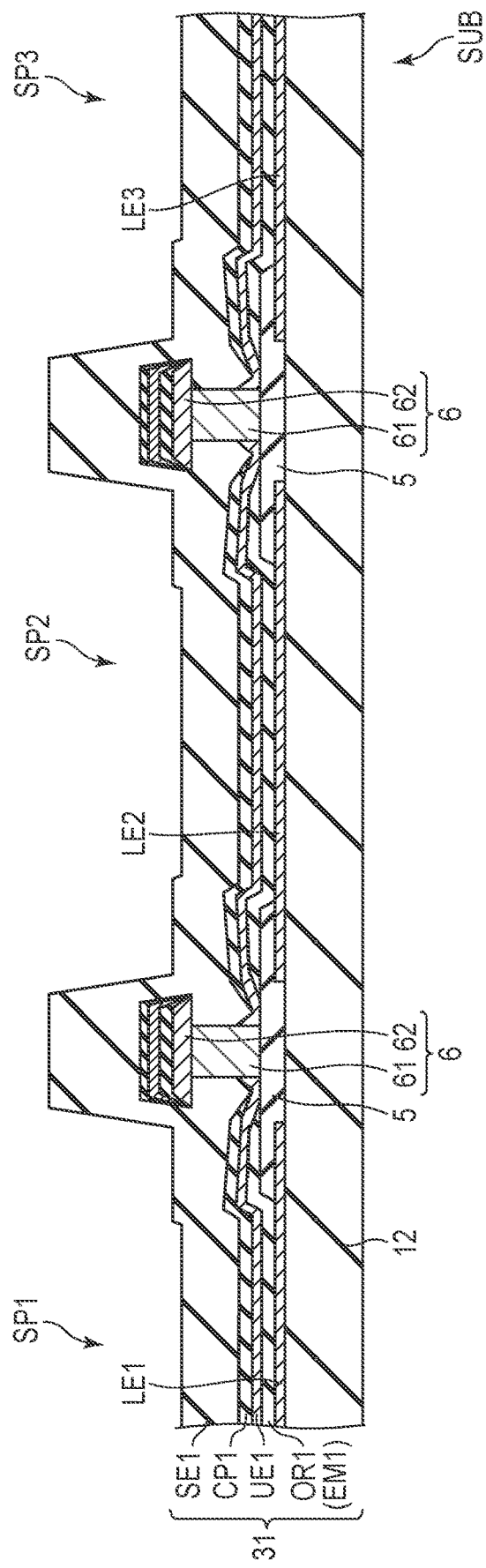
FIG. 15 is a diagram for explaining the manufacturing method of the display device DSP.

Then, in step ST21, as shown in FIG. 15, the first thin film 31 is formed over the subpixel SP1, the subpixel SP2, and the subpixel SP3. The step of forming the first thin film 31 includes: the step of forming the organic layer OR1 including the light-emitting layer EM1 on the processing substrate SUB; the step of forming the upper electrode UE1 on the organic layer OR1; the step of forming the cap layer CP1 on the upper electrode UE1; and the step of forming the sealing layer SE1 on the cap layer CP1. That is, in the example shown in the figures, the first thin film 31 includes the organic layer OR1, the upper electrode UE1, the cap layer CP1, and the sealing layer SE1.

The organic layer OR1 is formed on each of the lower electrode LE1, the lower electrode LE2, and the lower electrode LE3, and is also formed on the partition 6. Of the organic layer OR1, the portion formed on the upper part 62 is separated from the portion formed on each of the lower electrodes.

The upper electrode UE1 is formed on the organic layer OR1 directly above each of the lower electrode LE1, the lower electrode LE2, and the lower electrode LE3, covers the rib 5, and is in contact with the lower part 61 of the partition 6. In addition, the upper electrode UE1 is also formed on the organic layer OR1 directly above the upper part 62. Of the upper electrode UE1, the portion formed directly above the upper part 62 is separated from the portion formed directly above each of the lower electrodes.

The cap layer CP1 includes the transparent layer TL1 and the inorganic layer IL1, which are omitted in the figures. The cap layer CP1 is formed on the upper electrode UE1 directly above each of the lower electrode LE1, the lower electrode LE2, and the lower electrode LE3, and is also formed on the upper electrode UE1 directly above the upper part 62. Of the cap layer CP1, the portion formed directly above the upper part 62 is separated from the portion formed directly above each of the lower electrodes.

The sealing layer SE1 is formed to cover the cap layer CP1 and the partition 6. That is, the sealing layer SE1 is formed on the cap layer CP1 directly above each of the lower electrode LE1, the lower electrode LE2, and the lower electrode LE3, and is also formed on the cap layer CP1 directly above the upper part 62. Of the sealing layer SE1, the portion formed directly above the upper part 62 is connected to the portion formed directly above each of the lower electrodes. The sealing layer SE1 is formed of, for example, silicon nitride.

Figure 16:
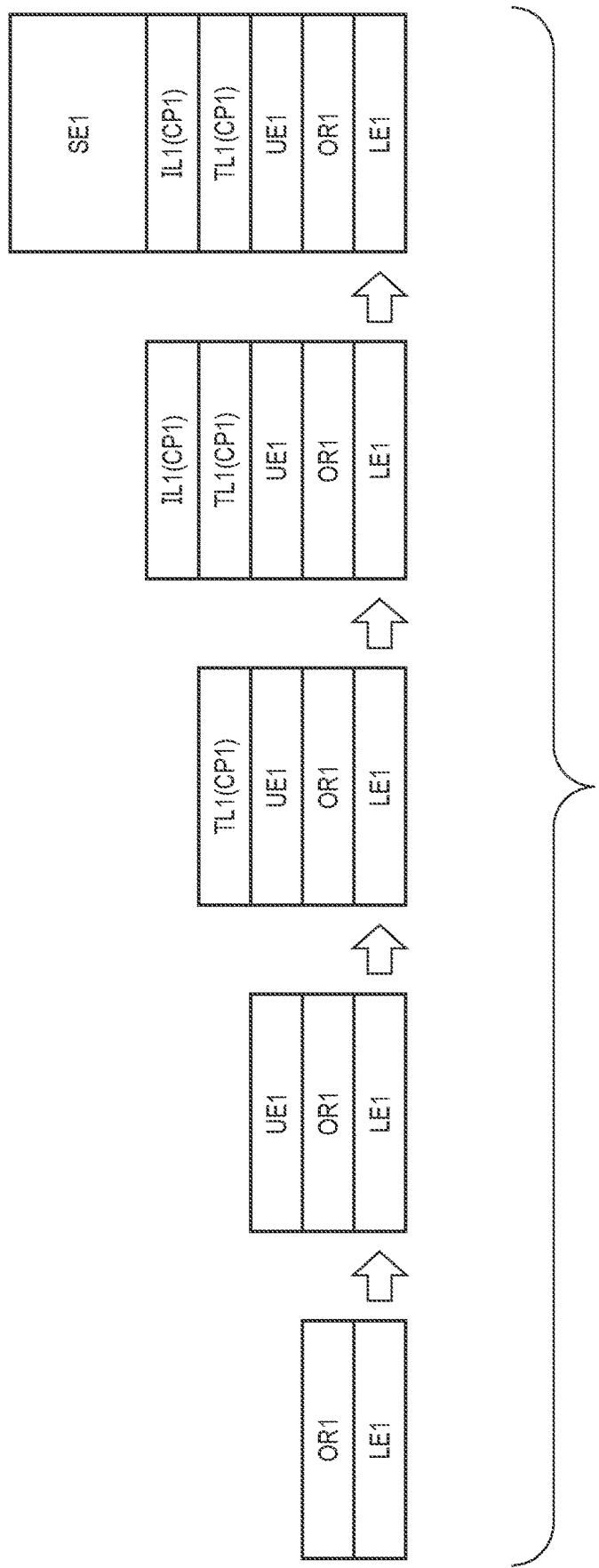
FIG. 16 is a diagram for explaining the formation process of the first thin film 31.

FIG. 16 is a diagram for explaining the formation process of the first thin film 31. The formation process of the first thin film 31 formed on the lower electrode LE1 is explained here as an example. The cross sections of the first thin film 31 on the lower electrode LE1 are arranged in the formation order from the left to the right of the figure.

First, the organic layer OR1 is formed on the lower electrode LE1. As described with reference to FIG. 4, the organic layer OR1 includes various functional layers and a light-emitting layer. Each layer of the organic layer OR1 is formed by a vapor deposition method.

Then, the upper electrode UE1 is formed on the organic layer OR1. The upper electrode UE1 is formed of an alloy of magnesium and silver by a vapor deposition method. The upper electrode UE1 can be formed in the evaporation device EVA described with reference to FIG. 7 or the evaporation device EVB described with reference to FIG. 8.

Then, the transparent layer TL1 of the cap layer CP1 is formed on the upper electrode UE1. The transparent layer TL1 is formed by, for example, a vapor deposition method.

Then, the inorganic layer IL1 of the cap layer CP1 is formed on the transparent layer TL1. The inorganic layer IL1 is formed of lithium fluoride by a vapor deposition method.

Then, the sealing layer SE1 is formed on the inorganic layer IL1. The sealing layer SE1 is formed by, for example, a CVD method.

Then, in step ST22, as shown in FIG. 17, the patterned first resist 41 on the sealing layer SE1 is formed. The first resist 41 covers the first thin film 31 of the subpixel SP1 and exposes the first thin film 31 of the subpixel SP2 and the subpixel SP3. That is, the first resist 41 overlaps the sealing layer SE1 located directly above the lower electrode LE1. In addition, the first resist 41 extends above the partition 6 from the subpixel SP1. On the partition 6 between the subpixel SP1 and the subpixel SP2, the first resist 41 is disposed on the subpixel SP1 side (left side of the figure) and exposes the sealing layer SE1 on the subpixel SP2 side (right side of the figure). In addition, the first resist 41 exposes the sealing layer SE1 in the subpixel SP2 and the subpixel SP3.

Figure 18:
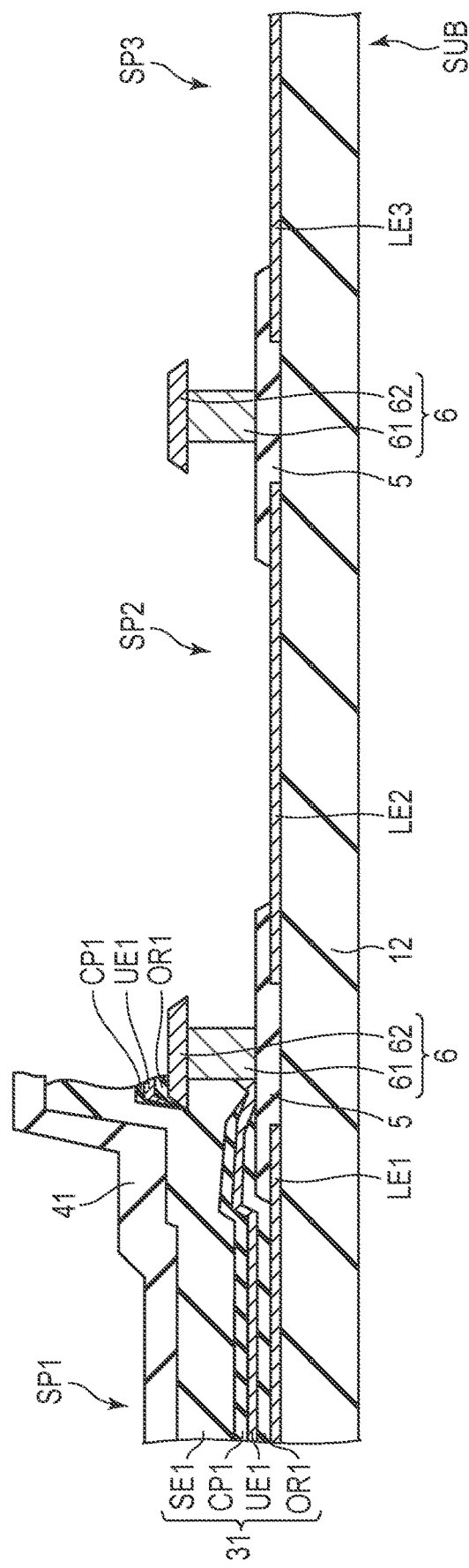
FIG. 18 is a diagram for explaining the manufacturing method of the display device DSP.

Then, in step ST23, as shown in FIG. 18, etching is performed with the first resist 41 used as a mask to remove the first thin film 31 of the subpixel SP2 and the subpixel SP3, which is exposed through the first resist 41, and the first thin film 31 remains in the subpixel SP1. In this way, in the subpixel SP2, the lower electrode LE2 is exposed and the rib 5 surrounding the lower electrode LE2 is exposed. In addition, in the subpixel SP3, the lower electrode LE3 is exposed and the rib 5 surrounding the lower electrode LE3 is exposed. Moreover, the subpixel SP2 side of the partition 6 between the subpixel SP1 and the subpixel SP2 is exposed. Furthermore, the partition 6 between the subpixel SP2 and the subpixel SP3 is exposed.

Figure 19:
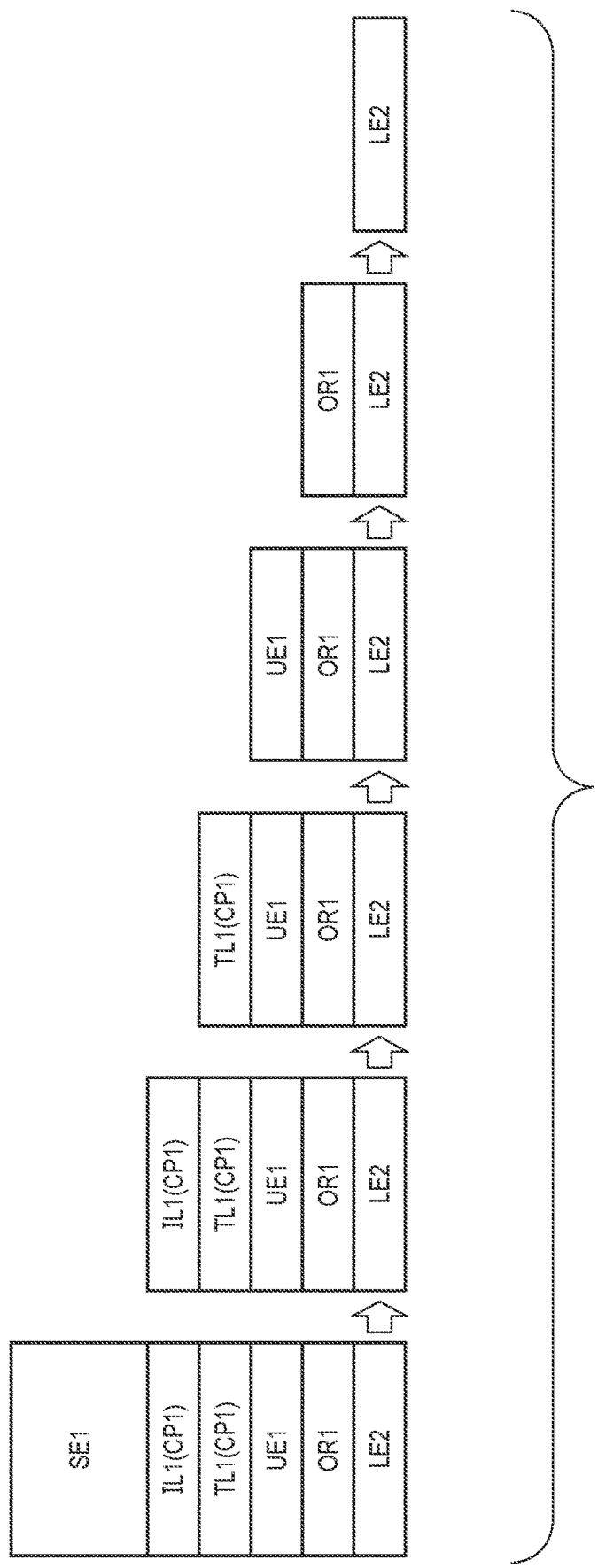
FIG. 19 is a diagram for explaining the removal process of the first thin film 31.

FIG. 19 is a diagram for explaining the removal process of the first thin film 31. The removal process of the first thin film 31 formed on the lower electrode LE2 in the subpixel SP2 is explained here as an example. The cross sections of the first thin film 31 on the lower electrode LE2 are arranged in the removal order from the left to the right of the figure.

First, dry etching is performed with the first resist 41 used as a mask, and the sealing layer SE1 exposed through the first resist 41 is removed.

Then, wet etching is performed with the first resist 41 used as a mask, and the inorganic layer IL1 of the cap layer CP1 exposed through the sealing layer SE1 is removed.

Then, dry etching is performed with the first resist 41 used as a mask, and the transparent layer TL1 of the cap layer CP1 exposed through the inorganic layer IL1 is removed.

Then, wet etching is performed with the first resist 41 used as a mask, and the upper electrode UE1 exposed through the transparent layer TL1 is removed.

Then, dry etching is performed with the first resist 41 used as a mask, the organic layer OR1 exposed through the upper electrode UE1 is removed, and the lower electrode LE2 is exposed.

Similarly, the sealing layer SE1, the cap layer CP1, the upper electrode UE1, and the organic layer OR1 in the subpixel SP3 are also removed.

Then, in step ST24, as shown in FIG. 20, the first resist 41 is removed. The sealing layer SE1 of the subpixel SP1 is thereby exposed. Through steps ST21 to ST24, the display element 201 is formed in the subpixel SP1. The display element 201 is constituted of the lower electrode LE1, the organic layer OR1 including the light-emitting layer EM1, the upper electrode UE1, and the cap layer CP1. In addition, the display element 201 is covered by the sealing layer SE1.

On the partition 6 between the subpixel SP1 and the subpixel SP2, a stacked layer body of the organic layer OR1 including the light-emitting layer EM1, the upper electrode UE1, the cap layer CP1, and the sealing layer SE1 is formed. In addition, the subpixel SP1 side of the partition 6 is covered by the sealing layer SE1. Note that the stacked layer body on the partition 6 shown in FIG. 20 can be removed completely.

According to the present embodiment, before the etching of the sealing layer SE1 is performed, at least one of the upper electrode UE1 and the inorganic layer IL1 of the cap layer CP1 covers the rib 5 between the partition 6 and the organic layer OR1 in the subpixels SP2 and SP3. Thus, the sealing layer SE1 never contacts the rib 5. The upper electrode UE1 and the inorganic layer IL1 function as etching stopper layers, and the etching rates of the upper electrode UE1 and the inorganic layer IL1 are less than the etching rate of the sealing layer SE1. Thus, at the time of the dry etching of the sealing layer SE1, after the sealing layer SE1 is removed completely, the progress of the dry etching can be stopped at the upper electrode UE1 or the inorganic layer IL1. Therefore, at the time of the dry etching of the sealing layer SE1, the rib 5 receives almost no damage. This configuration prevents the formation of an undesired hole (a penetration path for moisture) which penetrates the rib 5 so as to expose the insulating layer 12. Further, the configuration prevents the change in the colors of the lower electrodes because of the effect of undesired moisture. Moreover, the configuration prevents an occurrence of pixel defects in which the organic EL elements do not emit light because of damage to the anodes and the organic EL elements.

Accordingly, the degradation of reliability can be suppressed.

As described above, the present embodiment can provide a display device and a manufacturing method of the display device which can suppress the degradation of reliability and can improve manufacturing yield.

Based on the display device and its manufacturing method which have been described in the above-described embodiments, a person having ordinary skill in the art may achieve a display device and its manufacturing method with an arbitral design change; however, as long as they fall within the scope and spirit of the present invention, such a display device and manufacturing method are encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A display device comprising:
    a substrate;
    a lower electrode disposed above the substrate;
    a rib comprising an aperture overlapping the lower electrode;
    a partition comprising a lower part disposed on the rib and an upper part disposed on the lower part and projecting from a side surface of the lower part;
    an organic layer disposed on the lower electrode in the aperture;
    an upper electrode disposed on the organic layer;
    a transparent layer disposed on the upper electrode;
    an inorganic layer disposed on the transparent layer; and
    a sealing layer covering the inorganic layer and in contact with the lower part of the partition,
    the upper electrode comprising a first end portion and a second end portion opposite to the first end portion,
    the first end portion being covered by the inorganic layer,
    the second end portion being exposed through the inorganic layer and being covered by the sealing layer.

2. The display device of claim 1, wherein
    the lower part of the partition comprises a first side surface facing the first end portion and a second side surface facing the second end portion,
    the inorganic layer is in contact with the first side surface, and
    the upper electrode is in contact with the second side surface.

3. The display device of claim 2, wherein
a contact area between the first side surface and the inorganic layer is larger than a contact area between the first side surface and the upper electrode, and
a contact area between the second side surface and the upper electrode is larger than a contact area between the second side surface and the inorganic layer.

4. The display device of claim 1, wherein
the organic layer is separated from the partition, and
in a space between the organic layer and the partition, at least one of the upper electrode and the inorganic layer is interposed between the rib and the sealing layer.

5. The display device of claim 1, wherein the rib and the sealing layer are formed of silicon nitride.

6. The display device of claim 1, wherein the upper electrode is formed of an alloy of magnesium (Mg) and silver (Ag).

7. The display device of claim 1, wherein the inorganic layer is formed of lithium fluoride (LiF).

* * * * *